United States Patent
Sun

(10) Patent No.: US 12,211,425 B2
(45) Date of Patent: Jan. 28, 2025

(54) THIN FILM TRANSISTOR DISPLAY BASEPLATE, DISPLAY PANEL AND DISPLAY APPARATUS

(71) Applicants: Beijing BOE Technology Development Co., Ltd., Beijing (CN); BOE Technology Group Co., Ltd., Beijing (CN)

(72) Inventor: Tuo Sun, Beijing (CN)

(73) Assignees: Beijing BOE Technology Development Co., Ltd., Beijing (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 17/914,221

(22) PCT Filed: Aug. 26, 2021

(86) PCT No.: PCT/CN2021/114848
§ 371 (c)(1),
(2) Date: Sep. 23, 2022

(87) PCT Pub. No.: WO2023/024038
PCT Pub. Date: Mar. 2, 2023

(65) Prior Publication Data
US 2024/0233611 A1 Jul. 11, 2024

(51) Int. Cl.
*H01L 27/12* (2006.01)
*G09G 3/00* (2006.01)
(Continued)

(52) U.S. Cl.
CPC .............. *G09G 3/32* (2013.01); *G09G 3/002* (2013.01); *G09G 2300/02* (2013.01); *G09G 2310/0278* (2013.01)

(58) Field of Classification Search
CPC ...... G09G 3/32; G09G 3/002; G09G 2300/02; G09G 2310/0278
See application file for complete search history.

(56) References Cited

U.S. PATENT DOCUMENTS 10,916,185 B1 * 2/2021 Dai .......................... G09G 3/32
2016/0064421 A1 3/2016 Oh et al.
(Continued)

FOREIGN PATENT DOCUMENTS

CN 105390504 A 3/2016
CN 105552085 A 5/2016
(Continued)

OTHER PUBLICATIONS

PCT/CN2021/114848 international search report.
PCT/CN2021/114848 Written Opinion.

*Primary Examiner* — Kwang-Su Yang
(74) *Attorney, Agent, or Firm* — IPro, PLLC

(57) ABSTRACT

Display baseplates, display panels and display apparatuses are provided. A display baseplate includes a substrate, a polycrystalline silicon thin film transistor structure layer located on the substrate, an insulation layer located at a side of the polycrystalline silicon thin film transistor structure layer away from the substrate, an oxide thin film transistor structure layer located at a side of the insulation layer away from the substrate, and a plurality of sub-pixels located on the substrate, at least one of the sub-pixels includes a light-emitting element and a pixel circuit for driving the light-emitting element and including a polycrystalline silicon active layer located on the polycrystalline silicon thin film transistor structure layer and an oxide semiconductor active layer located on the oxide thin film transistor structure layer; orthographic projections of both the polycrystalline (Continued)

silicon active layer and the oxide semiconductor active layer on the substrate are at least partially overlapped.

19 Claims, 16 Drawing Sheets

(51) Int. Cl.
  *G09G 3/32* (2016.01)
  *H01L 21/77* (2017.01)

(56) References Cited

U.S. PATENT DOCUMENTS

| | | | |
|---|---|---|---|
| 2017/0249886 A1* | 8/2017 | Choi | H10K 59/90 |
| 2021/0202759 A1* | 7/2021 | Lee | H01L 29/42384 |
| 2021/0408082 A1 | 12/2021 | Xiao et al. | |
| 2022/0005901 A1* | 1/2022 | Tanaka | H01L 29/78618 |
| 2022/0302240 A1 | 9/2022 | Zhang et al. | |

FOREIGN PATENT DOCUMENTS

| | | | |
|---|---|---|---|
| CN | 110534531 A | 12/2019 | |
| CN | 110581142 A | 12/2019 | |
| CN | 110729309 A | 1/2020 | |
| CN | 110767665 A | 2/2020 | |
| CN | 111048561 A | 4/2020 | |
| CN | 111369943 A | 7/2020 | |
| CN | 212517205 U | 2/2021 | |

* cited by examiner

THIN FILM TRANSISTOR DISPLAY BASEPLATE, DISPLAY PANEL AND DISPLAY APPARATUS

CROSS-REFERENCE TO RELATED APPLICATION

The present application is a U.S. National Stage of International Application No. PCT/CN2021/114848 filed on Aug. 26, 2021, the entire content of which is incorporated herein by reference for all purposes.

TECHNICAL FIELD

The present disclosure relates to the field of display technologies and in particular to display baseplates, display panels and display apparatuses.

BACKGROUND

In recent years, along with development of display technologies, users have higher and higher needs for pixels per inch (PPI) of display panels. With increasing PPI of the display panels, a capacitor area of a pixel circuit decreases and a capacitor has a higher sensitivity to electric leakage. Generally, an oxide thin film transistor is introduced in a pixel circuit to reduce a leakage current while the advantages, such as fast drive speed, of a polycrystalline silicon thin film transistor are maintained.

However, the oxide thin film transistor may be affected by hydrogen element, oxygen element and a doping agent generated by an active layer and other film layers of the low temperature polycrystalline silicon thin film transistor, causing drift of characteristics of the oxide thin film transistor. Therefore, when a display panel is designed, the oxide thin film transistor is expected to avoid the low temperature polycrystalline silicon thin film transistor such that the pixel circuit occupies a larger space, which is unfavorable for design of a display panel with a high PPI.

SUMMARY

According to a first aspect of embodiments of the present disclosure, there is provided a display baseplate. The display baseplate includes a substrate, a polycrystalline silicon thin film transistor structure layer located on the substrate, an insulation layer located at a side of the polycrystalline silicon thin film transistor structure layer away from the substrate, and an oxide thin film transistor structure layer located at a side of the insulation layer away from the substrate.

The display baseplate includes a plurality of sub-pixels located on the substrate, and at least one of the sub-pixels includes a light-emitting element and a pixel circuit for driving the light-emitting element; the pixel circuit includes a polycrystalline silicon active layer located on the polycrystalline silicon thin film transistor structure layer and an oxide semiconductor active layer located on the oxide thin film transistor structure layer; an orthographic projection of the polycrystalline silicon active layer on the substrate is at least partially overlapped with an orthographic projection of the oxide semiconductor active layer on the substrate.

In an embodiment, the insulation layer has a thickness of 10 μm to 100 μm.

In an embodiment, the insulation layer includes one or more organic film layers and one or more inorganic film layers which are stacked alternately.

In an embodiment, the pixel circuit includes one or more polycrystalline silicon thin film transistors located on the polycrystalline silicon thin film transistor structure layer and one or more oxide semiconductor transistors located on the oxide thin film transistor structure layer; the polycrystalline silicon active layer includes a polycrystalline silicon active structure of each of the polycrystalline silicon thin film transistors, and the oxide semiconductor active layer includes an oxide semiconductor active structure of each of the oxide semiconductor transistors.

The one or more polycrystalline silicon thin film transistors include a threshold compensation transistor, the one or more oxide semiconductor transistors include a first reset transistor, and the first reset transistor is connected with the threshold compensation transistor.

In at least one of the pixel circuits, an orthographic projection of the polycrystalline silicon active structure of the threshold compensation transistor on the substrate is at least partially overlapped with an orthographic projection of the oxide semiconductor active structure of the first reset transistor on the substrate.

In an embodiment, the pixel circuit includes one or more polycrystalline silicon thin film transistors located on the polycrystalline silicon thin film transistor structure layer and one or more oxide semiconductor transistors located on the oxide thin film transistor structure layer.

The one or more polycrystalline silicon thin film transistors include a drive transistor, a data writing transistor and a threshold compensation transistor; the one or more oxide semiconductor transistors include a first light emission control transistor, a second light emission control transistor, a first reset transistor and a second reset transistor; a terminal of the first light emission control transistor is connected with the drive transistor and the data writing transistor respectively, and a terminal of the second light emission control transistor is connected with the light-emitting element and the second reset transistor respectively; a terminal of the first reset transistor is connected with the threshold compensation transistor.

In an embodiment, the polycrystalline silicon active layer includes a polycrystalline silicon active structure of each of the polycrystalline silicon thin film transistors, and the oxide semiconductor active layer includes an oxide semiconductor active structure of each of the oxide semiconductor transistors.

The oxide semiconductor active layer includes a first region, a second region and a third region of each of the pixel circuits, and the first region, the second region and the third region are disposed in a spacing; the first region includes an oxide semiconductor active structure of the second light emission control transistor and an oxide semiconductor active structure of the second reset transistor, the second region includes an oxide semiconductor active structure of the first light emission control transistor, and the third region includes an oxide semiconductor active structure of the first reset transistor; the polycrystalline silicon active layer includes a fourth region of each of the pixel circuits, the fourth region includes a polycrystalline silicon active structure of the drive transistor, a polycrystalline silicon active structure of the data writing transistor and a polycrystalline silicon active structure of the threshold compensation transistor.

In at least one of the pixel circuits, an orthographic projection of at least one of the first region, the second region or the third region on the substrate is at least partially overlapped with an orthographic projection of the fourth region on the substrate.

In an embodiment, in at least one of the pixel circuits, the orthographic projection of the first region on the substrate, the orthographic projection of the second region on the substrate and the orthographic projection of the third region on the substrate are all at least partially overlapped with the orthographic projection of the fourth region on the substrate.

In an embodiment, the polycrystalline silicon thin film transistor structure layer includes a first signal line, the oxide thin film transistor structure layer includes a second signal line, and an orthographic projection of the first signal line on the substrate is at least partially overlapped with an orthographic projection of the second signal line on the substrate.

In an embodiment, the pixel circuit includes one or more polycrystalline silicon thin film transistors located on the polycrystalline silicon thin film transistor structure layer and one or more oxide semiconductor transistors located on the oxide thin film transistor structure layer; the polycrystalline silicon active layer includes a polycrystalline silicon active structure of each of the polycrystalline silicon thin film transistors, and the oxide semiconductor active layer includes an oxide semiconductor active structure of each of the oxide semiconductor transistors; the one or more polycrystalline silicon thin film transistors include a threshold compensation transistor, the one or more oxide semiconductor transistors include a first reset transistor, and the first reset transistor is connected with the threshold compensation transistor.

The first signal line includes a scan signal line connected with a gate of the threshold compensation transistor, and the scan signal line is configured to provide a scan signal to the threshold compensation transistor; the second signal line includes a first reset control signal line connected with a gate of the first reset transistor, and the first reset control signal line is configured to provide a reset signal to the first reset transistor.

An orthographic projection of the scan signal line on the substrate is at least partially overlapped with an orthographic projection of the first reset control signal line on the substrate.

In an embodiment, the first signal line includes a data signal line configured to provide a data signal to the pixel circuit; the second signal line includes a power signal line configured to provide a power signal to the pixel circuit, and the data signal line and the power signal line extend in a same direction.

An orthographic projection of the data signal line on the substrate is at least partially overlapped with an orthographic projection of the power signal line on the substrate.

In an embodiment, the pixel circuit includes a capacitor, and the capacitor is located in the polycrystalline silicon thin film transistor structure layer.

In an embodiment, the capacitor includes a first pole plate and a second pole plate located at a side of the first pole plate away from the substrate.

The polycrystalline silicon thin film transistor structure layer includes a scan signal line and a data signal line, the scan signal line is configured to provide a scan signal to the pixel circuit, and the data signal line is configured to provide a data signal to the pixel circuit; the first pole plate and the scan signal line are disposed in a same layer; and the second pole plate is located between the first pole plate and the data signal line.

In an embodiment, the polycrystalline silicon thin film transistor structure layer further includes a first conductive layer located at a side of the polycrystalline silicon active layer away from the substrate, a second conductive layer located at a side of the first conductive layer away from the substrate and a third conductive layer located at a side of the second conductive layer away from the substrate; the polycrystalline silicon thin film transistor structure layer includes a capacitor.

The first conductive layer includes a first pole plate of the capacitor and a scan signal line configured to provide a scan signal to the pixel circuit.

The second conductive layer includes a second pole plate of the capacitor.

The third conductive layer includes a data signal line configured to provide a data signal to the pixel circuit.

In an embodiment, the pixel circuit includes one or more polycrystalline silicon thin film transistors located on the polycrystalline silicon thin film transistor structure layer and one or more oxide semiconductor transistors located on the oxide thin film transistor structure layer.

The third conductive layer further includes a connection portion configured to electrically connect the one or more polycrystalline silicon thin film transistors with the one or more oxide semiconductor transistors.

In an embodiment, the oxide thin film transistor structure layer further includes a fourth conductive layer located at a side of the oxide semiconductor active layer close to the substrate, a fifth conductive layer located at a side of the oxide semiconductor active layer away from the substrate, and a sixth conductive layer located at a side of the fifth conductive layer away from the substrate.

The fourth conductive layer includes an auxiliary signal line.

The fifth conductive layer includes a light emission control signal line, a first reset control signal line, a reset power signal line and a second reset control signal line; the light emission control signal line is configured to provide a light emission control signal to the pixel circuit, the first reset control signal line and the second reset control signal line are configured to provide one or more reset control signals to the pixel circuit, the reset power signal line is configured to provide a reset power signal to the pixel circuit; the auxiliary signal line is connected with the reset power signal line in parallel.

The sixth conductive layer includes a power signal line configured to provide a power signal to the pixel circuit.

In an embodiment, the pixel circuit includes one or more polycrystalline silicon thin film transistors located on the polycrystalline silicon thin film transistor structure layer and one or more oxide semiconductor transistors located on the oxide thin film transistor structure layer.

The fourth conductive layer further includes a conductive structure, the sixth conductive layer further includes a connection structure, the conductive structure and the connection structure are configured to electrically connect the one or more polycrystalline silicon thin film transistors with the one or more oxide semiconductor transistors.

According to a second aspect of embodiments of the present disclosure, there is provided a display panel, including the above display baseplate.

According to a third aspect of embodiments of the present disclosure, there is provided a display apparatus, including the above display panel.

The embodiments of the present disclosure have following major technical effects.

In a display baseplates, the display panels and the display apparatuses according to the embodiments of the present disclosure, an insulation layer is disposed between a polycrystalline silicon thin film transistor structure layer and an oxide thin film transistor structure layer, and the insulation layer can block diffusion of hydrogen element, oxygen element and a doping agent generated by a polycrystalline silicon active layer toward an oxide semiconductor active layer so as to prevent their influence on characteristics of one or more thin film transistors. Further, there is a time interval between a preparation process of the polycrystalline silicon thin film transistor structure layer and a preparation process of the oxide thin film transistor structure layer, which helps to prevent the influence of hydrogen element, oxygen element and the doping agent generated by the polycrystalline silicon thin film transistor structure layer on the oxide semiconductor active layer. Therefore, an orthographic projection of the polycrystalline silicon active layer on the substrate may be at least partially overlapped with an orthographic projection of the oxide semiconductor active layer on the substrate such that the pixel circuit occupies a smaller space, helping to increase PPI of the display baseplate; furthermore, the insulation layer also helps to avoid generating a parasitic capacitor between a conductive film layer of the polycrystalline silicon thin film transistor structure layer and a conductive film layer of the oxide thin film transistor structure layer. Because the polycrystalline silicon thin film transistor structure layer is prepared prior to the insulation layer, a processing temperature of the polycrystalline silicon thin film transistor structure layer will not affect the insulation layer. The oxide thin film transistor structure layer is prepared after the insulation layer, but the oxide thin film transistor structure layer will not affect the insulation layer due to a low processing temperature of the oxide thin film transistor structure layer.

DETAILED DESCRIPTION OF THE EMBODIMENTS

Figure 1:
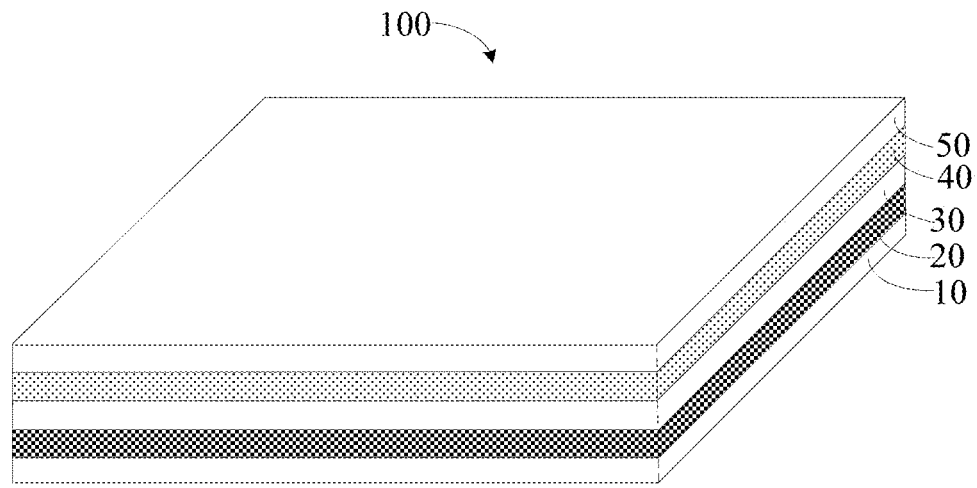
FIG. 1 is a stereoscopic structural schematic diagram illustrating a display baseplate according to an embodiment of the present disclosure.

Examples will be described in detail herein, with the illustrations thereof represented in the drawings. When the following descriptions involve the drawings, like numerals in different drawings refer to like or similar elements unless otherwise indicated. Embodiments described in the following examples do not represent all embodiments consistent with the present disclosure. Rather, they are merely examples of apparatuses and methods consistent with some aspects of the present disclosure as detailed in the appended claims.

The terms used in the present disclosure are for the purpose of describing particular examples only, and are not intended to limit the present disclosure. Terms "a". "the" and "this" in their singular forms in the present disclosure and the appended claims are also intended to include plurality, unless clearly indicated otherwise in the context. It should also be understood that the term "and/or" as used herein refers to and includes any and all possible combinations of one or more of the associated listed items.

It is to be understood that, although the terms "first," "second." "third," and the like may be used in the present disclosure to describe various information, such information should not be limited to these terms. These terms are only used to distinguish one category of information from another. For example, without departing from the scope of the present disclosure, first information may be referred as second information; and similarly, the second information may also be referred as the first information. Depending on the context, the term "if" as used herein may be interpreted as "when" or "upon" or "in response to determining".

Embodiments of the present disclosure provide a display baseplate, a display panel and a display apparatus. Detailed descriptions will be made below to the display baseplate, the display panel and the display apparatus in the embodiments of the present disclosure in combination with the accompanying drawings. In a case of no conflicts, the features of the following embodiments can be mutually supplemented or combined.

An embodiment of the present disclosure provides a display baseplate. With reference to FIG. 1, a display baseplate 100 includes a substrate 10, a polycrystalline silicon thin film transistor structure layer 20 located on the substrate 10, an insulation layer 30 located at a side of the polycrystalline silicon thin film transistor structure layer 20 away from the substrate 10, an oxide thin film transistor structure layer 40 located at a side of the insulation layer 30 away from the substrate 10, and a light-emitting layer 50 located at a side of the oxide thin film transistor structure layer 40 away from the substrate 10.

In an embodiment, the display baseplate is a flexible display baseplate, and the substrate 10 may be a flexible substrate made of an organic material.

The display baseplate 100 includes a plurality of sub-pixels located on the substrate 10, and at least one of the sub-pixels includes a light-emitting element and a pixel circuit for driving the light-emitting element. The pixel circuit includes a polycrystalline silicon active layer located on the polycrystalline silicon thin film transistor structure layer and an oxide semiconductor active layer located on the oxide thin film transistor structure layer. The pixel circuit includes at least one polycrystalline silicon thin film transistor located on the polycrystalline silicon thin film transistor structure layer and at least one oxide semiconductor transistor located on the oxide thin film transistor structure layer.

In an embodiment, the light-emitting elements of the display baseplate are arranged in a first direction and a second direction, where the first direction intersects with the second direction. For example, the first direction is perpendicular to the second direction. In some embodiments, the first direction is a row direction and the second direction is a column direction. The first direction may be Y direction shown in FIGS. 3 to 15 and the second direction may be X direction shown in FIGS. 3 to 15.

The light-emitting element of each of the sub-pixels includes a first electrode, a second electrode and a light-emitting material layer disposed between the first electrode and the second electrode. The first electrode of the light-emitting element is electrically connected with the pixel circuit. In some embodiments, the first electrode is an anode, the second electrode is a cathode, and the second electrodes of all sub-pixels of the display baseplate may be connected to form a surface electrode.

In an embodiment, the light-emitting element may be an Organic Light Emitting Diode (OLED), and the light-emitting material layer may be an organic light-emitting material layer. In other embodiments, the light-emitting element may be a Quantum Dot Light Emitting Diode (QLED) and the light-emitting material layer may be a quantum dot light-emitting material layer.

Figure 2:
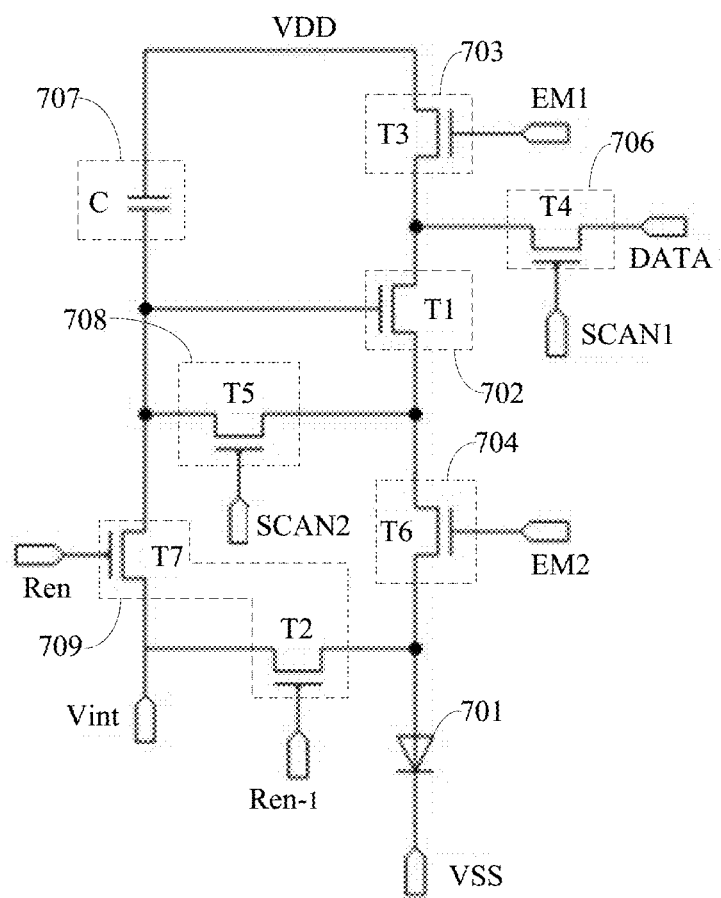
FIG. 2 is a circuit diagram illustrating a pixel circuit according to an embodiment of the present disclosure.

In an embodiment, as shown in FIG. 2, the pixel circuit includes a driving circuit 702, a first light emission control circuit 703 and a second light emission control circuit 704. The driving circuit 702 includes a control terminal, a first terminal and a second terminal, and is configured to provide to the light-emitting element 701 a drive current for driving the light-emitting element 701 to emit light. For example, the first light emission control circuit 703 is connected with a first terminal of the driving circuit 702 and a power signal line VDD, and is configured to perform connection or disconnection between the driving circuit 702 and the power signal line VDD; the second light emission control circuit 704 is electrically connected with a second terminal of the driving circuit 702 and a first electrode of the light-emitting element 701 and is configured to perform connection or disconnection between the driving circuit 702 and the light-emitting element 701.

In an embodiment, as shown in FIG. 2, the pixel circuit further includes a data writing circuit 706, a storage circuit 707, a threshold compensation circuit 708 and a reset circuit 709. The data writing circuit 706 is electrically connected with the first terminal of the driving circuit 702 and configured to write a data signal into the storage circuit 707 under control of a scan signal. The storage circuit 707 is electrically connected with a control terminal of the driving circuit 702 and the power signal line VDD and configured to store the data signal. The threshold compensation circuit 708 is electrically connected with the control terminal and the second terminal of the driving circuit 702 and configured to perform threshold compensation for the driving circuit 702. The reset circuit 709 is electrically connected with the control terminal of the driving circuit 702 and the first electrode of the light-emitting element 701 and is configured to reset the control terminal of the driving circuit 702 and the first electrode of the light-emitting element 701 under control of a reset control signal.

In an embodiment, as shown in FIG. 2, the driving circuit 702 includes a drive transistor T1, the control terminal of the driving circuit 702 includes a gate electrode of the drive transistor T1, the first terminal of the driving circuit 702 includes a first pole of the drive transistor T1 and the second terminal of the driving circuit 702 includes a second pole of the drive transistor T1.

In an embodiment, as shown in FIG. 2, the data writing circuit 706 includes a data writing transistor T4, the storage circuit 707 includes a capacitor C, the threshold compensation circuit 708 includes a threshold compensation transistor T5, the first light emission control circuit 703 includes a first light emission control transistor T3, the second light emission control circuit 704 includes a second light emission control transistor T6, the reset circuit 709 includes a first reset transistor T7 and a second reset transistor T2, and the reset control signal may include a first sub-reset control signal and a second sub-reset control signal.

In an embodiment, as shown in FIG. 2, a first pole of the data writing transistor T4 is electrically connected with the first pole of the drive transistor T1, a second pole of the data writing transistor T4 is configured to electrically connect with a data signal line DATA to receive a data signal, and a gate of the data writing transistor T4 is configured to electrically connect with a scan signal line SCAN1 to receive a scan signal; a first pole plate of the capacitor C is electrically connected with the power signal line VDD, and a second pole plate of the capacitor C is electrically connected with the gate of the drive transistor T1; a first pole of the threshold compensation transistor T5 is electrically connected with the second pole of the drive transistor T1, a second pole of the threshold compensation transistor T5 is electrically connected with the gate of the drive transistor T1, and a gate of the threshold compensation transistor T5 is configured to electrically connect with a scan signal line SCAN2 to receive a compensation control signal; a first pole of the first reset transistor T7 is configured to electrically connect with a reset power signal line Vint to receive a first reset signal, a second pole of the first reset transistor T7 is electrically connected with the gate of the drive transistor T1, and a gate of the first reset transistor T7 is configured to electrically connect with a first reset control signal line Ren to receive a first sub-reset control signal; a first pole of the second reset transistor T2 is configured to electrically connect with a second reset control signal line Ren-1 to receive a second reset signal, a second pole of the second reset transistor T2 is electrically connected with the first electrode of the light-emitting element 701, and a gate of the second reset transistor T2 is configured to electrically connect with the second reset control signal line Ren-1 to receive a second sub-reset control signal; a first pole of the first light emission control transistor T3 is electrically connected with the power signal line VDD, a second pole of the first light emission control transistor T3 is electrically connected with the first pole of the drive transistor T1, and a gate of the first light emission control transistor T3 is configured to electrically connect with a light emission control signal line EM1 to receive a first light emission control signal; a first pole of the second light emission control transistor T6 is electrically connected with the second pole of the drive transistor T1, a second pole of the second light emission control transistor T6 is electrically connected with the first electrode of the light-emitting element 701, and a gate of the second light emission control transistor T6 is configured to electrically connect with a light emission control signal line EM2 to receive a second light emission control signal; the first electrode of the light-emitting element 701 is electrically connected with a power signal line VSS.

In an embodiment, one of the power signal line VDD and the power signal line VSS is a high voltage terminal and the other is a low voltage terminal. For example, in an example shown in FIG. 2, the power signal line VDD may be a voltage source to output a constant first voltage which is a positive voltage; the power signal line VSS may be a voltage source to output a constant second voltage which is a negative voltage and so on. For example, in some examples, the power signal line VSS may be earthed.

In an embodiment, as shown in FIG. 2, the scan signal and the compensation control signal may be identical, that is, the gate of the data writing transistor T4 and the gate of the threshold compensation transistor T5 may be electrically connected to a same signal line, for example, to the scan signal line SCAN1 so as to receive a same signal (e.g., scan signal). At this time, the display baseplate 100 may not be provided with the scan signal line SCAN2 to reduce a number of the signal lines. For another example, the gate of the data writing transistor T4 and the gate of the threshold compensation transistor T5 may be electrically connected to different signal lines respectively, that is, the gate of the data writing transistor T4 is electrically connected to the scan signal line SCAN1 and the gate of the threshold compensation transistor T5 is electrically connected to the scan signal line SCAN2 where the scan signal line SCAN1 and the scan signal line SCAN2 transmit a same signal.

It is noted that the scan signal and the compensation control signal may also be different such that the gate of the data writing transistor T4 and the gate of the threshold compensation transistor T5 can be controlled separately, increasing the flexibility of controlling the pixel circuit.

In an embodiment, as shown in FIG. 2, the first light emission control signal and the second light emission control signal may be identical, that is, the gate of the first light emission control transistor T3 and the gate of the second light emission control transistor T6 may be electrically connected to a same signal line, for example, to the light emission control signal line EM1, so as to receive a same signal (e.g., the first light emission control signal). At this time, the display baseplate 100 may not be provided with the light emission control signal line EM2 to reduce the number of the signal lines. For another example, the gate of the first light emission control transistor T3 and the gate of the second light emission control transistor T6 may be electrically connected to different signal lines respectively, that is, the gate of the first light emission control transistor T3 is electrically connected to the light emission control signal line EM1 and the gate of the second light emission control transistor T6 is electrically connected to the light emission control signal line EM2 where the light emission control signal line EM1 and the light emission control signal line EM2 transmit a same signal.

It is noted that, when the first light emission control transistor T3 and the second light emission control transistor T6 are different types of transistors, for example, when the first light emission control transistor T3 is a P type transistor and the second light emission control transistor T6 is an N type transistor, the first light emission control signal and the second light emission control signal may also be different, which is not limited in the embodiments of the present disclosure.

For example, the first sub-reset control signal and the second sub-reset control signal may be identical, that is, the gate of the first reset transistor T7 and the gate of the second reset transistor T2 may be electrically connected to a same signal line, for example, to the first reset control signal line Ren, to receive a same signal (e.g., the first sub-reset control signal). At this time, the display baseplate 100 may not be provided with the second reset control signal line Ren-1 to reduce the number of the signal lines. For another example, the gate of the first reset transistor T7 and the gate of the second reset transistor T2 may be electrically connected to different signal lines respectively, that is, the gate of the first reset transistor T7 is electrically connected to the first reset control signal line Ren, and the gate of the second reset transistor T2 is electrically connected to the second reset control signal line Ren-1, where the first reset control signal line Ren and the second reset control signal line Ren-1 transmit a same signal. It is noted that the first sub-reset control signal and the second sub-reset control signal may also be different.

In some embodiments, the second sub-reset control signal may be identical to the scan signal, that is, the gate of the second reset transistor T2 may be electrically connected to the scan signal line SCAN1 to receive the scan signal as the second sub-reset control signal.

In an embodiment, the gate of the first reset transistor T7 and a source of the second reset transistor T2 may be respectively connected to the reset power signal line Vint which may be a direct current reference voltage terminal for outputting a constant direct current reference voltage. The gate of the first reset transistor T7 and the source of the second reset transistor T2 may be connected to a same reset power signal line Vint or to different reset power signal lines. The reset power signal line Vint may be a high voltage signal line or a low voltage signal line as long as it can provide a reset signal to reset the gate of the drive transistor T1 and the first electrode of the light-emitting element 701. No limitation is made to the above in the present disclosure.

It is noted that the driving circuit 702, the data writing circuit 706, the storage circuit 707, the threshold compensation circuit 708 and the reset circuit 709 in the pixel circuit shown in FIG. 2 are merely illustrative, and specific structures of the driving circuit 702, the data writing circuit 706, the storage circuit 707, the threshold compensation circuit 708 and the reset circuit 709 and the like may be disposed according to actual application requirements, which is not limited in the embodiments of the present disclosure.

For example, based on characteristics of transistors, the transistors may be divided into N type transistors and P type transistors. For the purpose of clarity, in the embodiments of the present disclosure, technical solutions of the present disclosure will be described in details with the transistors as P type transistors (e.g., P type MOS transistor). That is, in the descriptions of the present disclosure, the drive transistor T1, the data writing transistor T4, the threshold compensation transistor T5, the first light emission control transistor T3, the second light emission control transistor T6, the first reset transistor T7 and the second reset transistor T2 are all P type transistors. But, the transistors in the embodiments of the present disclosure are not limited to the P type transistors and those skilled in the art may use N type transistors (e.g., N type MOS transistors) based on actual needs to achieve functions of one or more transistors in the embodiments of the present disclosure.

It is noted that the transistors adopted in the embodiments of the present disclosure may be thin film transistors or field effect transistors or other switching devices with same characteristics. The thin film transistors may include oxide semiconductor thin film transistors, amorphous silicon thin film transistors or polycrystalline silicon thin film transistors or the like. A source and a drain of a transistor may be structurally symmetric and thus the source and the drain may be identical in physical structure. In embodiments of the present disclosure, in order to distinguish transistors, except for the gate acting as a control pole, one of the poles thereof is described as a first pole and the other one of the poles thereof is described as a second pole. Therefore, in the embodiments of the present disclosure, the first pole and the second pole of all or some transistors may be interchangeable based on actual needs.

It is to be noted that, in the embodiments of the present disclosure, a pixel circuit of the sub-pixel may be a 7T1C (i.e., 7 transistors and 1 capacitor) structure shown in FIG. 2 and may also be a structure including another number of transistors or capacitors, such as 7T2C structure, 6T1C structure, 6T2C structure or 9T2C structure, which is not limited in the embodiments of the present disclosure.

FIGS. 3 to 15 are schematic diagrams illustrating various layers of a pixel circuit according to some embodiments of the present disclosure. A position relationship of each of circuits in the pixel circuit on a backplate will be described below in combination with FIGS. 3 to 15. In examples shown in FIGS. 3 to 15, a pixel circuit of one sub-pixel is taken as an example. As shown in FIGS. 2 to 15, the pixel circuit of the sub-pixel includes the drive transistor T1, the data writing transistor T4, the threshold compensation transistor T5, the first light emission control transistor T3, the second light emission control transistor T6, the first reset transistor T7, the second reset transistor T2 and the capacitor C as shown in FIG. 2.

FIGS. 3 to 15 also illustrate a scan signal line SCAN1, a first reset control signal line Ren, a second reset control signal line Ren-1, a reset power signal line Vint, a light emission control signal line EM1, a data signal line DATA and a power signal line VDD, which are electrically connected to the pixel circuit of the sub-pixel.

In the embodiments shown in FIGS. 3 to 15, a polycrystalline silicon thin film transistor structure layer 20 may include a polycrystalline silicon active layer 21, a first conductive layer 22, a second conductive layer 23 and a third conductive layer 25. An oxide thin film transistor structure layer 40 may include a fourth conductive layer 41, an oxide semiconductor active layer 42, a fifth conductive layer 43 and a sixth conductive layer 45.

Figure 3:
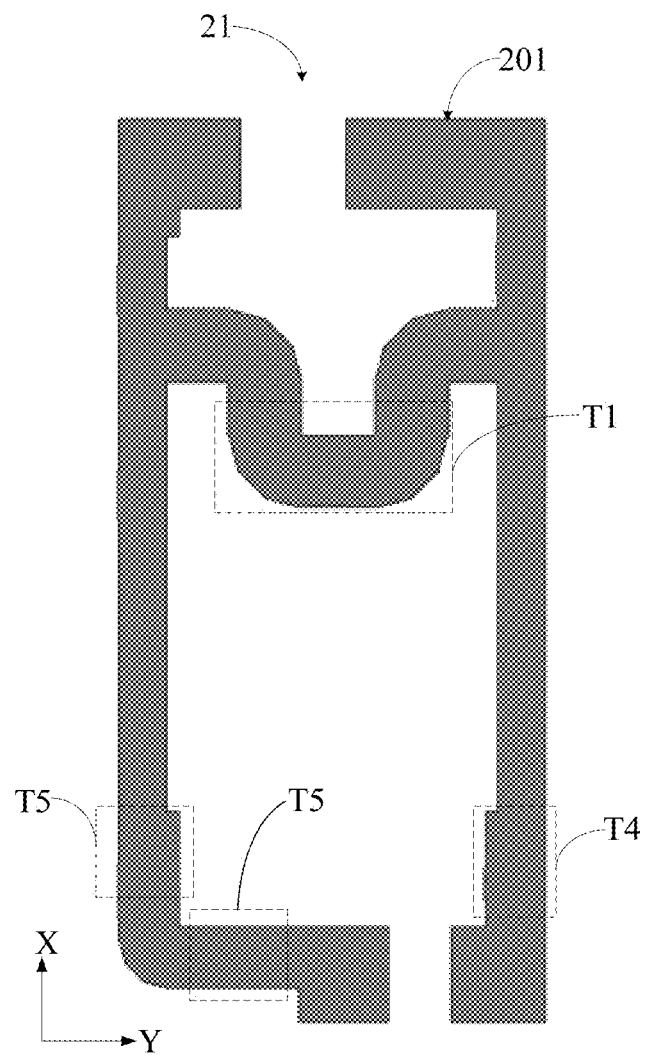
FIGS. 3 to 15 are partial views illustrating various layers of a display baseplate according to an embodiment of the present disclosure.

FIG. 3 illustrates the polycrystalline silicon active layer 21 of the polycrystalline silicon thin film transistor structure layer 20 of a display baseplate. The polycrystalline silicon active layer 21 may be formed by patterning a polycrystalline silicon semiconductor material. The polycrystalline silicon active layer 21 may be for manufacturing a polycrystalline silicon active structure of each of polycrystalline silicon thin film transistors. The polycrystalline silicon active structure of the polycrystalline silicon thin film transistor includes an active layer pattern and a doping region pattern, and the active layer pattern and the doping region pattern of each of the polycrystalline silicon thin film transistors are integrally disposed. The active layer pattern is a channel of the polycrystalline silicon thin film transistor. A doping region includes a source region and a drain region of the polycrystalline silicon thin film transistor. In the polycrystalline silicon active structure of a same polycrystalline silicon thin film transistor, two doping region patterns are partitioned by the channel.

In some embodiments, the polycrystalline silicon thin film transistor includes the drive transistor T1, the data writing transistor T4 and the threshold compensation transistor T5. The polycrystalline silicon active layer 21 includes polycrystalline silicon active structures of the drive transistor T1, the data writing transistor T4 and the threshold compensation transistor T5.

In some embodiments, the polycrystalline silicon thin film transistor in a same pixel circuit includes a doping region pattern and an active layer pattern, and polycrystalline silicon active structures of different polycrystalline silicon thin film transistors are partitioned by a doping structure.

In an embodiment, as shown in FIG. 3, the polycrystalline silicon active layer 21 includes a fourth region 201 of each pixel circuit. The fourth region 201 of a same pixel circuit includes the polycrystalline silicon active structure of the drive transistor T1, the polycrystalline silicon active structure of the data writing transistor T4 and the polycrystalline silicon active structure of the threshold compensation transistor T5. That is, polycrystalline silicon active structures of various polycrystalline silicon thin film transistors in a same pixel circuit may be an integral pattern.

In an embodiment, the polycrystalline silicon active layer 21 has a thickness of 10 nm to 100 nm. In some embodiments, the polycrystalline silicon active layer 21 has a thickness of, for example, 10 nm, 30 nm, 50 nm, 70 nm, 90 nm or 100 nm or the like.

In an embodiment, the polycrystalline silicon active layer 21 may be prepared by using an excimer laser annealing process.

Figure 6:
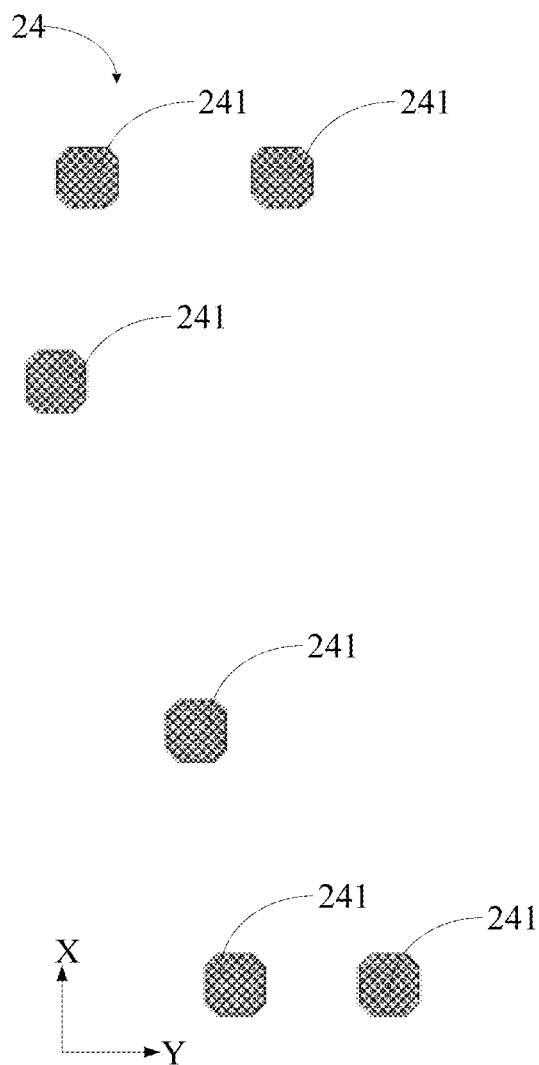
Figure 7:
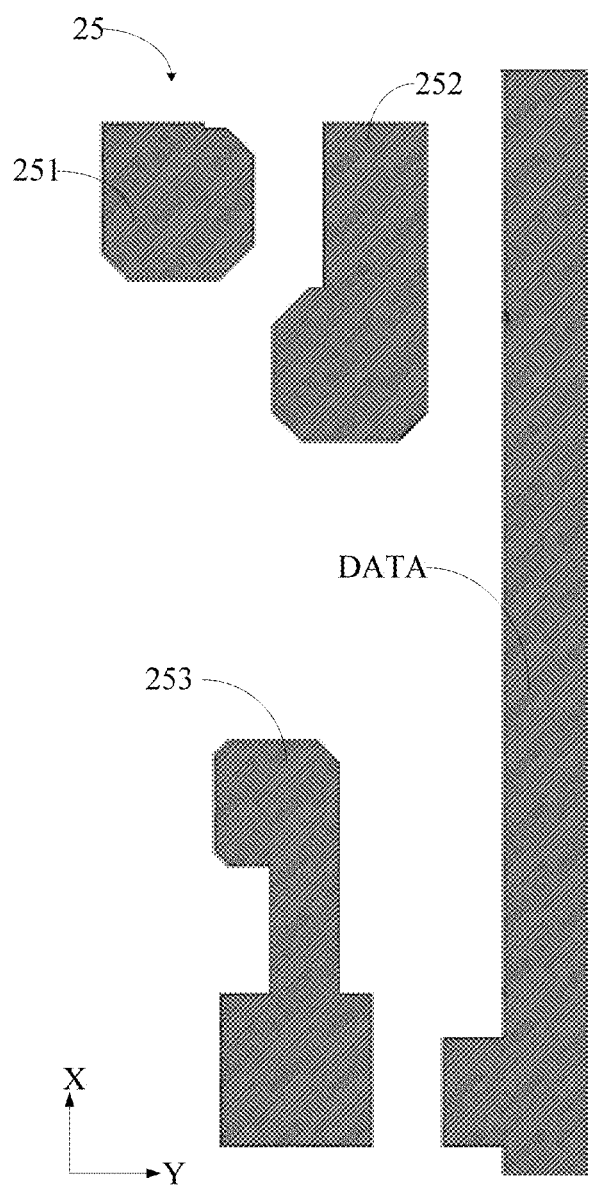
Figure 8:
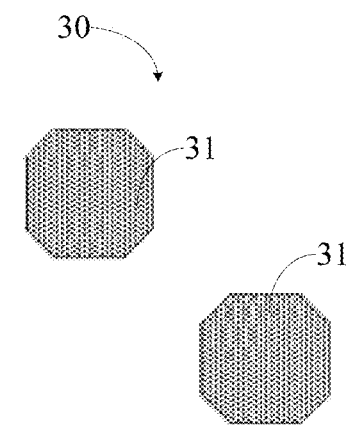
Figure 8:
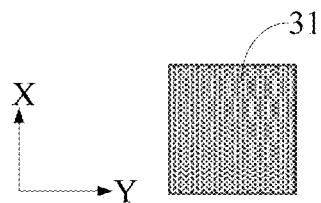

In an embodiment, the polycrystalline silicon thin film transistor structure layer 20 includes a gate insulation layer 26 between the polycrystalline silicon active layer 21 and the first conductive layer 22 (as shown in FIGS. 6 to 8), and the gate insulation layer 26 is for protecting the above polycrystalline silicon active layer 21.

In an embodiment, the gate insulation layer 26 has a thickness of 40 nm to 80 nm. In some embodiments, the gate insulation layer 26 has a thickness of, for example, 40 nm, 50 nm, 60 nm, 70 nm or 80 nm or the like.

In an embodiment, the gate insulation layer 26 may be a composite film layer including a silicon nitride film layer and a silicon oxide film layer, and the gate insulation layer 26 may be prepared by using Plasma Enhanced Chemical Vapor Deposition (PECVD).

Figure 4:
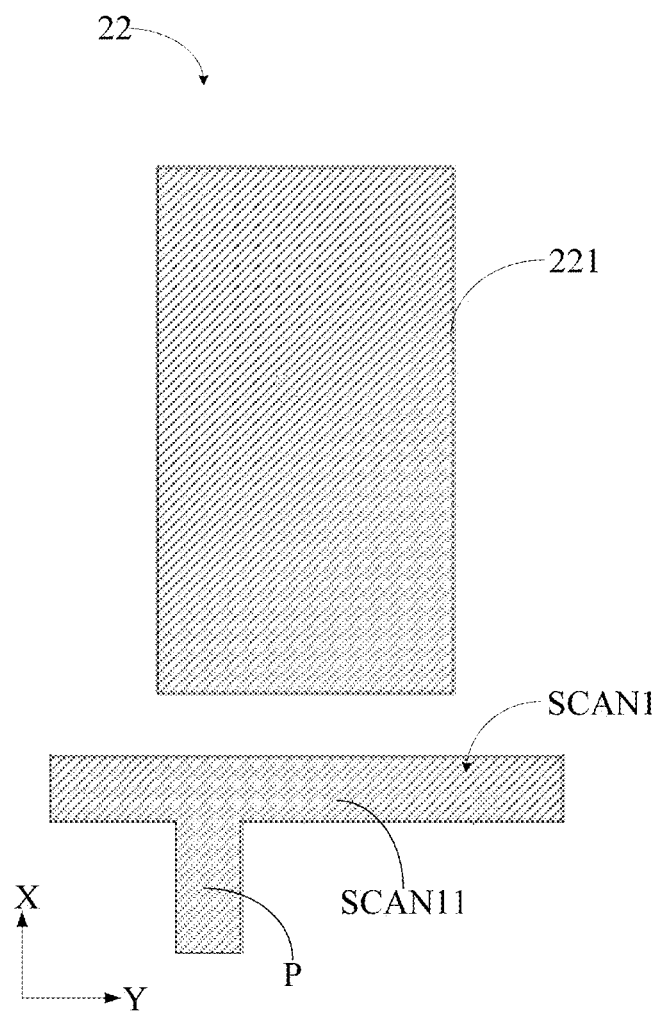

FIG. 4 illustrates the first conductive layer 22 of the polycrystalline silicon thin film transistor structure layer 20 of the display baseplate. The first conductive layer 22 is disposed on the gate insulation layer 26 to be insulated from the polycrystalline silicon active layer 21. The first conductive layer 22 includes a first pole plate 221 of the capacitor C, the scan signal line SCAN1 and gates of the drive transistor T1, the data writing transistor T4 and the threshold compensation transistor T5.

In an embodiment, the scan signal line SCAN1 includes a main body part SCAN11 and a protrusion part P protruded from the main body part SCAN11 toward a side away from the first pole plate 221. The gate of the drive transistor T1 may be the first pole plate 221 of the capacitor C; the gate of the data writing transistor T4 may be a part of an overlap between the main body part SCAN11 of the scan signal line and the polycrystalline silicon active layer 21; the threshold compensation transistor T5 includes two gates, one of the gates may be a part of the overlap between the main body part SCAN11 of the scan signal line and the polycrystalline silicon active layer 21, and the other may be a part of an overlap between the protrusion part P of the main body part SCAN11 of the scan signal line and the polycrystalline silicon active layer 21. It is noted that each dashed line rectangular box in FIG. 3 illustrates each overlapping part between the first conductive layer 22 and the polycrystalline silicon active layer 21.

In an embodiment, as shown in FIG. 4, the scan signal line SCAN1 is arranged in a second direction X. In an embodiment, in the second direction X, the display baseplate has opposing first side and second side. As shown in FIGS. 3 and 4, in the second direction X, the gate of the threshold compensation transistor T5 and the gate of the data writing transistor T4 are both located at a second side of the gate of the drive transistor T1. For example, in an XY plane, a first side of the gate of the drive transistor T1 of the pixel circuit of the sub-pixel may be an upper side of the gate of the drive transistor T1, and the second side of the gate of the drive transistor T1 of the pixel circuit of the sub-pixel may be a lower side of the gate of the drive transistor T1. The lower side, for example, a side of the display baseplate for binding IC, is a lower side of the display baseplate, and the lower side of the gate of the drive transistor T1 is a side of the gate of the drive transistor T1 closer to the IC. The upper side is an opposing side of the lower side, for example, a side of the gate of the drive transistor T1 farther away from the IC.

In an embodiment, in a first direction Y, the display baseplate has opposing third side and fourth side. As shown in FIG. 4, in the first direction Y, the gate of the data writing transistor T4 is located at a fourth side of the gate of the drive transistor T1. For example, as shown in FIG. 4, a third side of the gate of the drive transistor T1 of the pixel circuit of the sub-pixel may be a left side of the gate of the drive transistor T1 of the pixel circuit of the sub-pixel, and the fourth side of the gate of the drive transistor T1 of the pixel circuit of the sub-pixel may be a right side of the gate of the drive transistor T1 of the pixel circuit of the sub-pixel.

In an embodiment, the first conductive layer 22 has a thickness of 200 nm to 800 nm. In some embodiments, the first conductive layer 22 has a thickness of, for example, 200 nm, 300 nm, 400 nm, 500 nm, 600 nm, 700 nm or 800 nm or the like.

In an embodiment, a material of the first conductive layer 22 includes at least one of metal molybdenum, metal aluminum, metal titanium or metal copper.

In an embodiment, the first conductive layer 22 may be formed by using magnetron sputter process, evaporation process or electroplating process.

Figure 16:
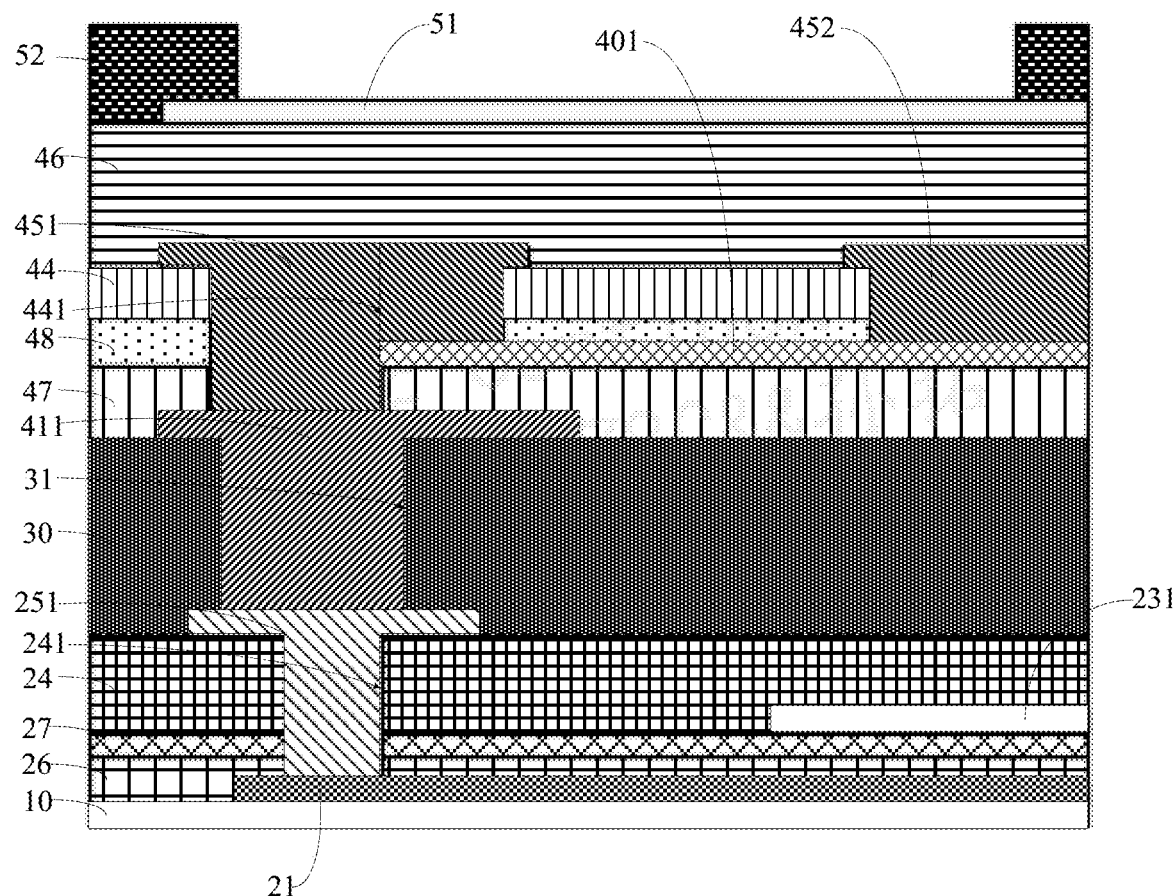
FIG. 16 is a sectional view taken along a straight line AA in the structure shown in FIG. 15.
Figure 17:
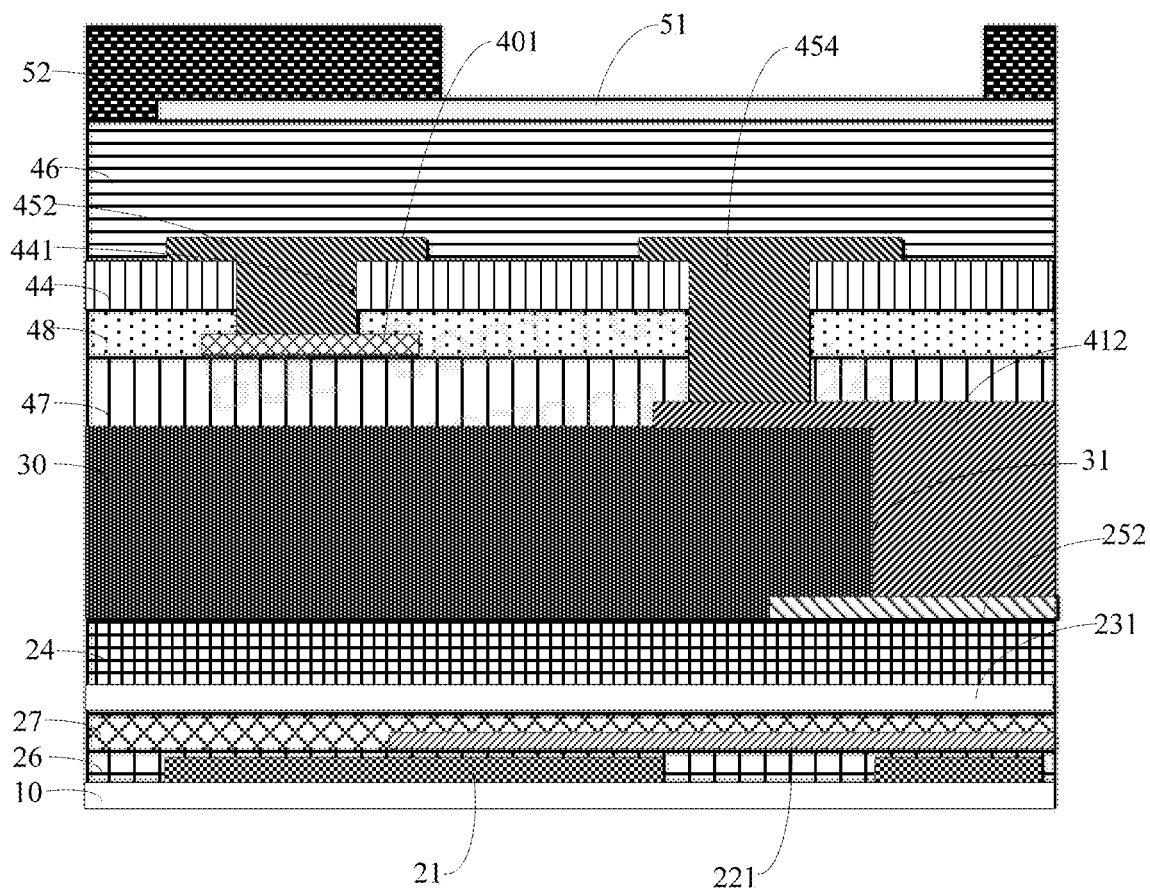
FIG. 17 is a sectional view taken along a straight line BB in the structure shown in FIG. 15.
Figure 18:
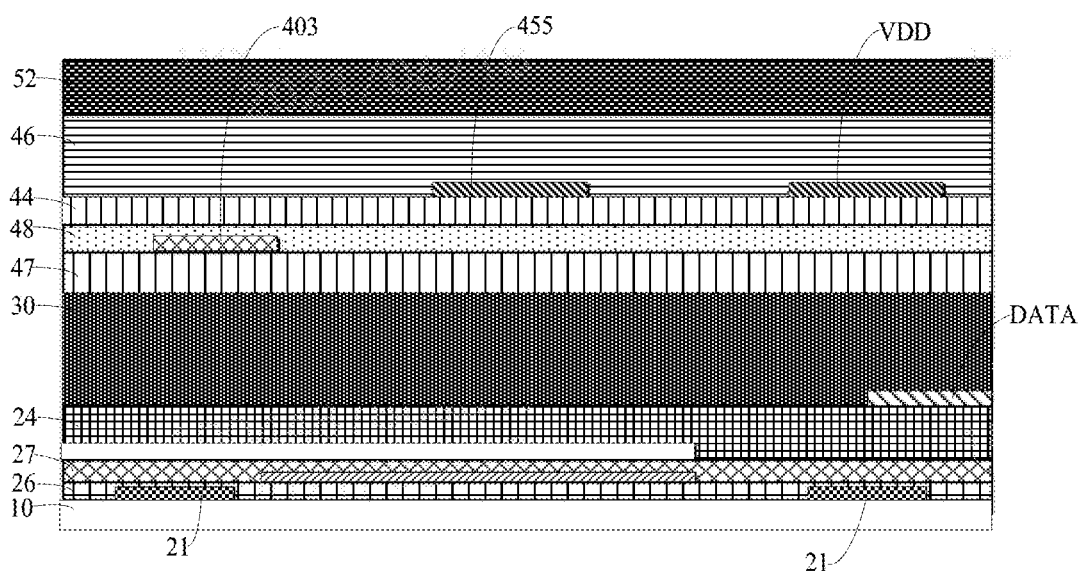
FIG. 18 is a sectional view taken along a straight line CC in the structure shown in FIG. 15.

In an embodiment, the polycrystalline silicon thin film transistor structure layer 20 includes a first insulation layer 27 between the first conductive layer 22 and the second conductive layer 23 (as shown in FIGS. 16 to 18), and the first insulation layer 27 is for protecting the above first conductive layer 22.

Figure 5:
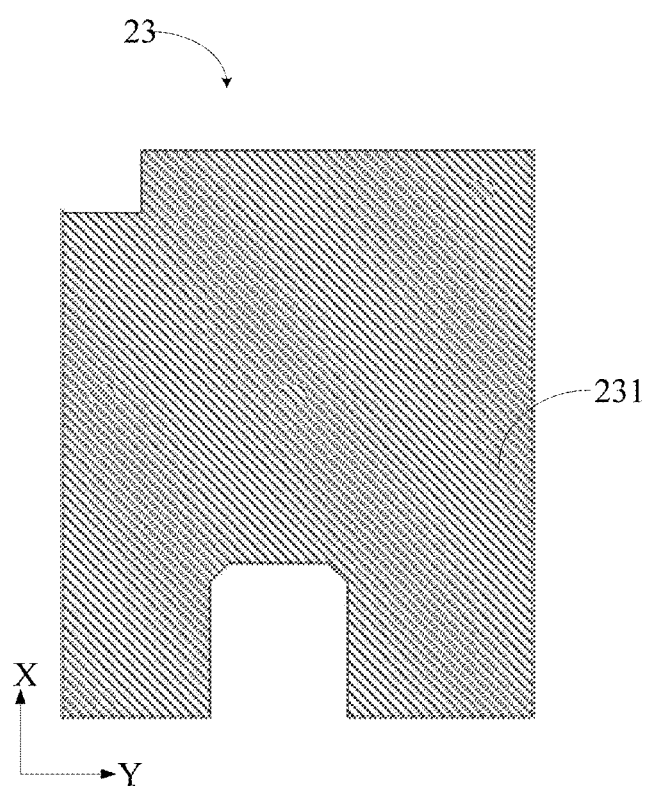

FIG. 5 illustrates the second conductive layer 23 of the polycrystalline silicon thin film transistor structure layer 20 of the display baseplate. The second conductive layer 23 is disposed on the first insulation layer 27 to be insulated from the first conductive layer 22. As shown in FIG. 5, the second conductive layer 23 includes a second pole plate 231 of the capacitor C. The first pole plate 221 and the second pole plate 231 of the capacitor C are at least partially overlapped to form the capacitor C.

In an embodiment, the second conductive layer 23 has a thickness of 200 nm to 800 nm. In some embodiments, the second conductive layer 23 has a thickness of, for example, 200 nm, 300 nm, 400 nm, 500 nm, 600 nm, 700 nm or 800 nm or the like.

In an embodiment, a material of the second conductive layer 23 includes at least one of metal molybdenum, metal aluminum, metal titanium or metal copper.

In an embodiment, the second conductive layer 23 may be formed by using magnetron sputter process, evaporation process or electroplating process.

In an embodiment, the polycrystalline silicon thin film transistor structure layer 20 includes a second insulation layer 24 between the second conductive layer 23 and the third conductive layer 25 (as shown in FIGS. 16 to 18) and a plurality of via holes are disposed on the second insulation layer 24. FIG. 6 is a schematic diagram illustrating a plurality of via holes 241 of the second insulation layer 24. Referring to FIG. 6, a plurality of spaced via holes 241 are disposed on the second insulation layer 24 to electrically connect a conductive layer located at a side of the second insulation layer 24 away from the substrate with a conductive layer located at a side of the second insulation layer 24 close to the substrate.

In an embodiment, the second insulation layer 24 has a thickness of 400 nm to 800 nm. In some embodiments, the second insulation layer 24 has a thickness of, for example, 400 nm, 500 nm, 600 nm, 700 nm or 800 nm or the like.

In an embodiment, the second insulation layer includes at least one of a silicon nitride film layer, a silicon oxide film layer or a silicon oxynitride film layer, and the second insulation layer 24 may be prepared using the PECVD.

In an embodiment, the polycrystalline silicon thin film transistor structure layer 20 includes a third conductive layer 25 between the second insulation layer 24 and an insulation layer 30. The insulation layer 30 is for protecting the above third conductive layer 25 and insulate the third conductive layer 25 from a fourth conductive layer 41. FIG. 7 illustrates the third conductive layer 25 of the polycrystalline silicon thin film transistor structure layer 20 of the display baseplate. Referring to FIG. 7, the third conductive layer 25 includes a data signal line DATA and a plurality of connection parts. The plurality of connection parts include a first connection part 251, a second connection part 252 and a third connection part 253.

In an embodiment, the third conductive layer 25 has a thickness of 200 nm to 800 nm. In some embodiments, the third conductive layer 25 has a thickness of, for example, 200 nm, 300 nm, 400 nm, 500 nm, 600 nm, 700 nm or 800 nm or the like.

In an embodiment, a material of the third conductive layer 25 includes at least one of metal molybdenum, metal aluminum, metal titanium or metal copper.

In an embodiment, the third conductive layer 25 may be formed by using magnetron sputter process, evaporation process or electroplating process.

In an embodiment, a plurality of via holes 31 are disposed on the insulation layer 30 of the display baseplate. In a same pixel circuit, elements of the polycrystalline silicon thin film transistor structure layer 20 are electrically connected with elements of the oxide thin film transistor structure layer 40 through the via holes 31.

Figure 9:
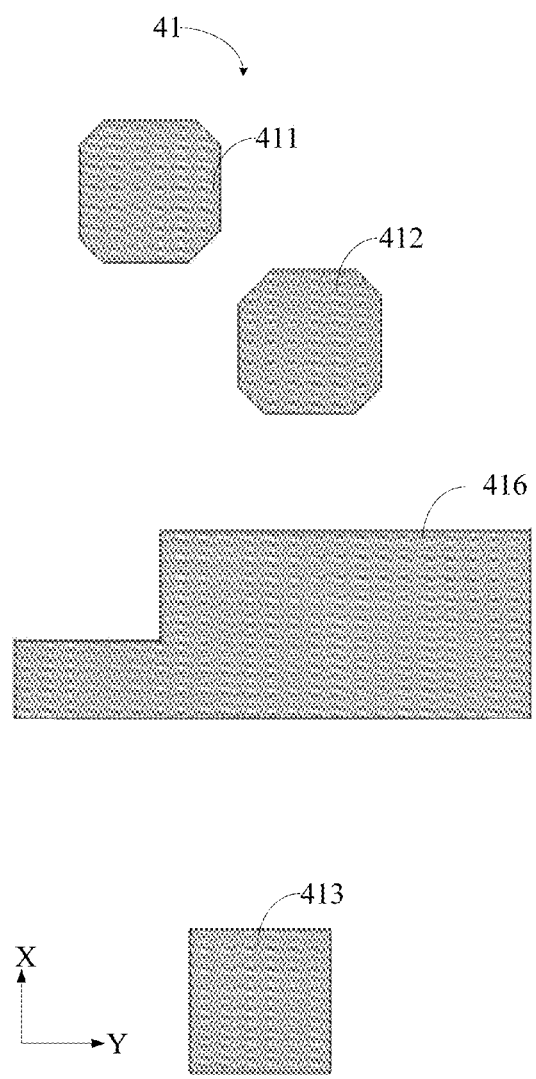

In an embodiment, the oxide thin film transistor structure layer 40 includes a fourth conductive layer 41 located at a side of the insulation layer 30 away from the substrate. As shown in FIG. 9, the fourth conductive layer 41 includes an auxiliary signal line 416 and a plurality of conductive structures. The plurality of conductive structures include a first conductive structure 411, a second conductive structure 412 and a third conductive structure 413. The auxiliary signal line 416 extends along the first direction Y.

In an embodiment, the oxide thin film transistor structure layer 40 includes a third insulation layer 47 between the fourth conductive layer 41 and the oxide semiconductor active layer 42 (as shown in FIGS. 16 to 18). The third insulation layer 47 is for protecting the above fourth conductive layer 41. FIG. 5 illustrates an oxide semiconductor active layer 42 of the oxide thin film transistor structure layer 40. The oxide semiconductor active layer 42 may be formed by patterning an oxide semiconductor material. The oxide semiconductor active layer 42 may be for manufacturing an oxide semiconductor active structure of an oxide semiconductor transistor. The oxide semiconductor active structure of the oxide semiconductor transistor includes an active layer pattern and two doping region patterns, where the active layer pattern is a channel of the oxide semiconductor transistor and the two doping regions are a source region and a drain region of the oxide semiconductor transistor.

In some embodiments, the oxide semiconductor transistor includes a first light emission control transistor T3, a second light emission control transistor T6, a first reset transistor T7 and a second reset transistor T2. The oxide semiconductor active layer 42 includes oxide semiconductor active structures of the first light emission control transistor T3, the second light emission control transistor T6, the first reset transistor T7 and the second reset transistor T2.

In some embodiments, a source region and a drain region of the oxide semiconductor active structure may be made conductive by doping to achieve electrical connection of each structure.

In an embodiment, the oxide semiconductor active layer 42 has a thickness of 4 nm to 10 nm. In some embodiments, the oxide semiconductor active layer 42 has a thickness of, for example, 4 nm, 5 nm, 400 nm, 6 nm, 7 nm, 8 nm, 9 nm or 10 nm or the like.

In an embodiment, a material of the oxide semiconductor active layer 42 includes at least one of IGZO, IZO or IGZXO, where X in IGZXO represents some elements such as Sn and the like.

In an embodiment, the oxide semiconductor active layer 42 may be formed by using magnetron sputter process and etch process, where the etch process is, for example, a wet etch process.

Figure 10:
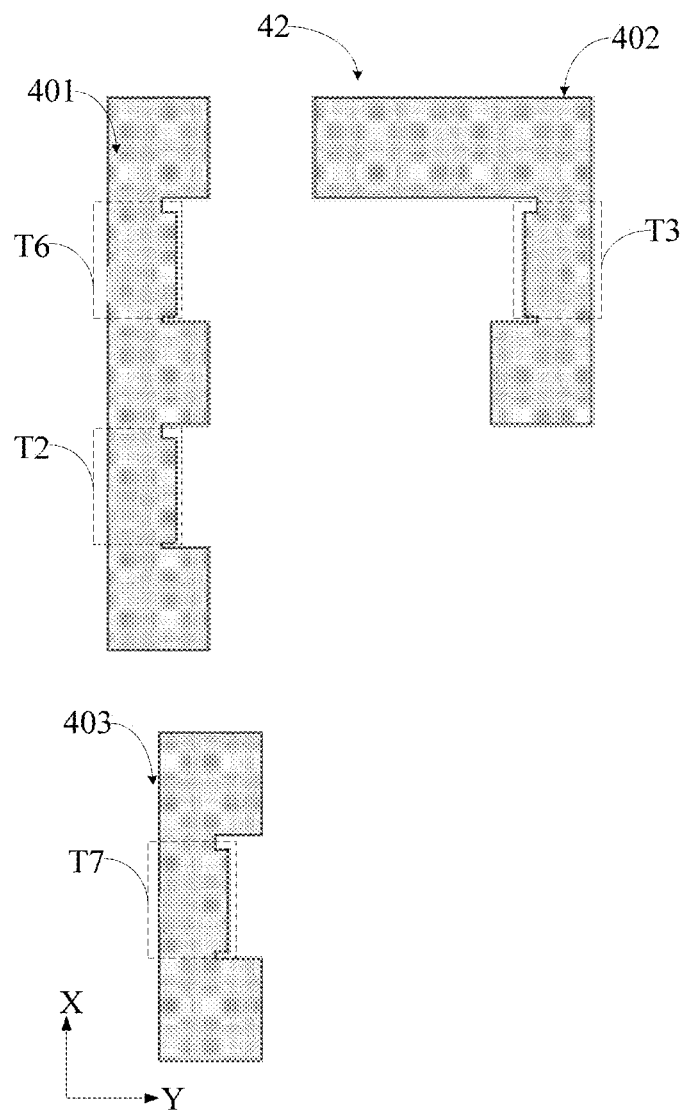

In an embodiment, as shown in FIG. 10, the oxide semiconductor active layer 42 includes a first region 401, a second region 402 and a third region 403 of each pixel circuit, where the first region 401, the second region 402 and the third region 403 are disposed in a spacing. The first region 401 includes an oxide semiconductor active structure of the second light emission control transistor T6 and an oxide semiconductor active structure of the second reset transistor T2, the second region 402 includes an oxide semiconductor active structure of the first light emission control transistor T3, and the third region 403 includes an oxide semiconductor active structure of the first reset transistor T7.

In an embodiment, the oxide thin film transistor structure layer 40 includes a fourth insulation layer 48 between the oxide semiconductor active layer 42 and a fifth conductive layer 43 (as shown in FIGS. 16 to 18), and the fourth insulation layer 48 is for protecting the above oxide semiconductor active layer 42.

Figure 11:
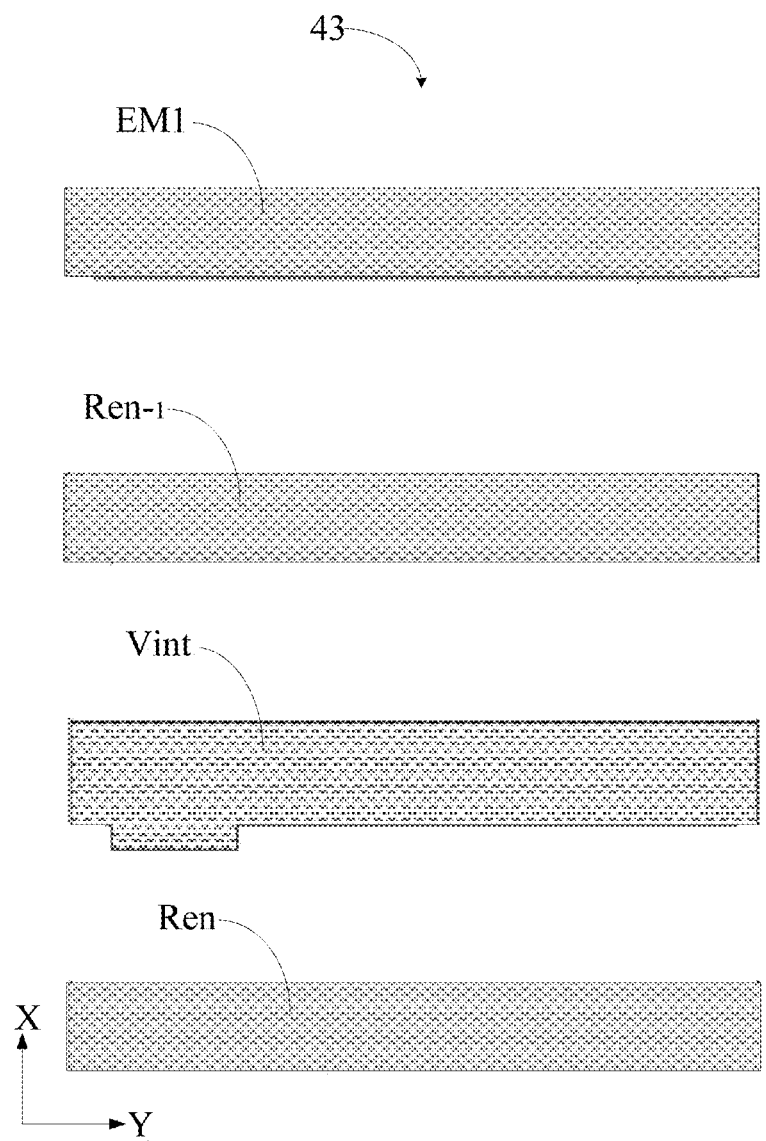

FIG. 11 illustrates the fifth conductive layer 43 of the oxide thin film transistor structure layer 40. The fifth conductive layer 43 is disposed on the fourth insulation layer 48 and thus is insulated from the oxide semiconductor active layer 42. Referring to FIG. 11, the fifth conductive layer 43 includes a light emission control signal line EM1, a second reset control signal line Ren-1, a reset power signal line Vint, a first reset control signal line Ren and gates of the first light emission control transistor T3, the second light emission control transistor T6, the first reset transistor T7 and the second reset transistor T2.

In an embodiment, the light emission control signal line EM1, the second reset control signal line Ren-1, the reset power signal line Vint, the first reset control signal line Ren all extend along a first direction Y.

In an embodiment, the gate of the first light emission control transistor T3 may be an overlapping part of the light emission control signal line EM1 and the second region 402 of the oxide semiconductor active layer 42; the gate of the second light emission control transistor T6 may be an overlapping part of the light emission control signal line EM1 and the first region 401 of the oxide semiconductor active layer 42; the gate of the second reset transistor T2 may be an overlapping part of the second reset control signal line Ren-1 and the first region 401 of the oxide semiconductor active layer 42; the gate of the first reset transistor T7 may be an overlapping part of the first reset control signal line Ren and the third region 403 of the oxide semiconductor active layer 42. It is to be noted that each dashed line rectangular box in FIG. 10 illustrates each overlapping part of the fifth conductive layer 43 and the oxide semiconductor active layer 42.

Figure 12:
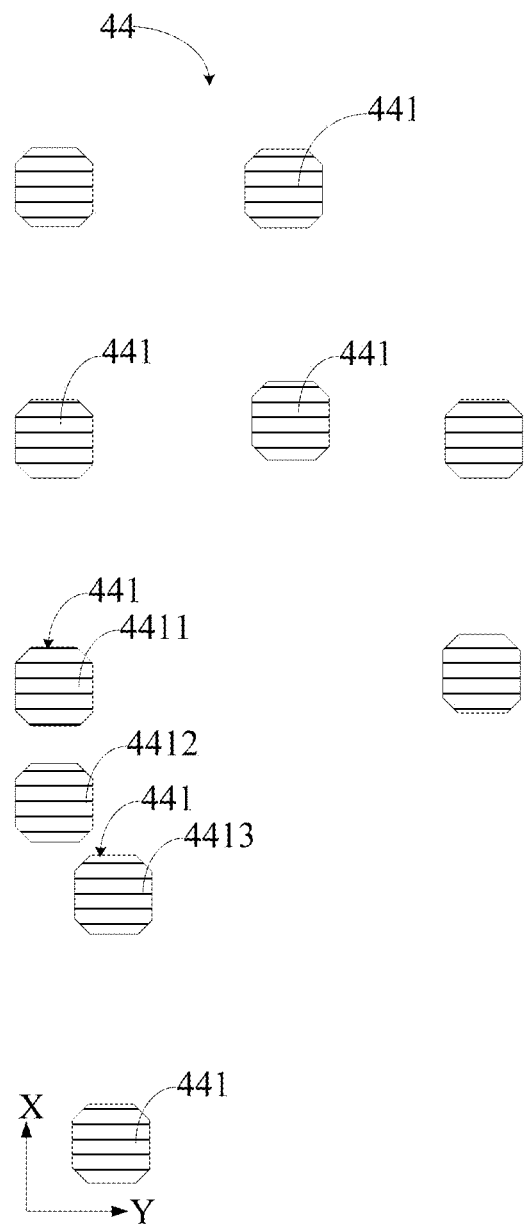

In an embodiment, the oxide thin film transistor structure layer 40 includes a fifth insulation layer 44 between the fifth conductive layer 43 and a sixth conductive layer 45 (as shown in FIGS. 16 to 18), and the fifth insulation layer 44 is for protecting the above fifth conductive layer 43. FIG. 12 illustrates a plurality of via holes of the fifth insulation layer 44 of the oxide thin film transistor structure layer 40, where a plurality of spaced via holes 441 are disposed on the fifth insulation layer 44.

In some embodiments, the fifth insulation layer 44 has a thickness of 50 nm to 200 nm. In some embodiments, the fifth insulation layer 44 has a thickness of, for example, 50 nm, 100 nm, 150 nm or 200 nm or the like.

In an embodiment, the fifth insulation layer 44 includes a silicon nitride film layer, and the fifth insulation layer 44 may be prepared using the PECVD.

Figure 13:
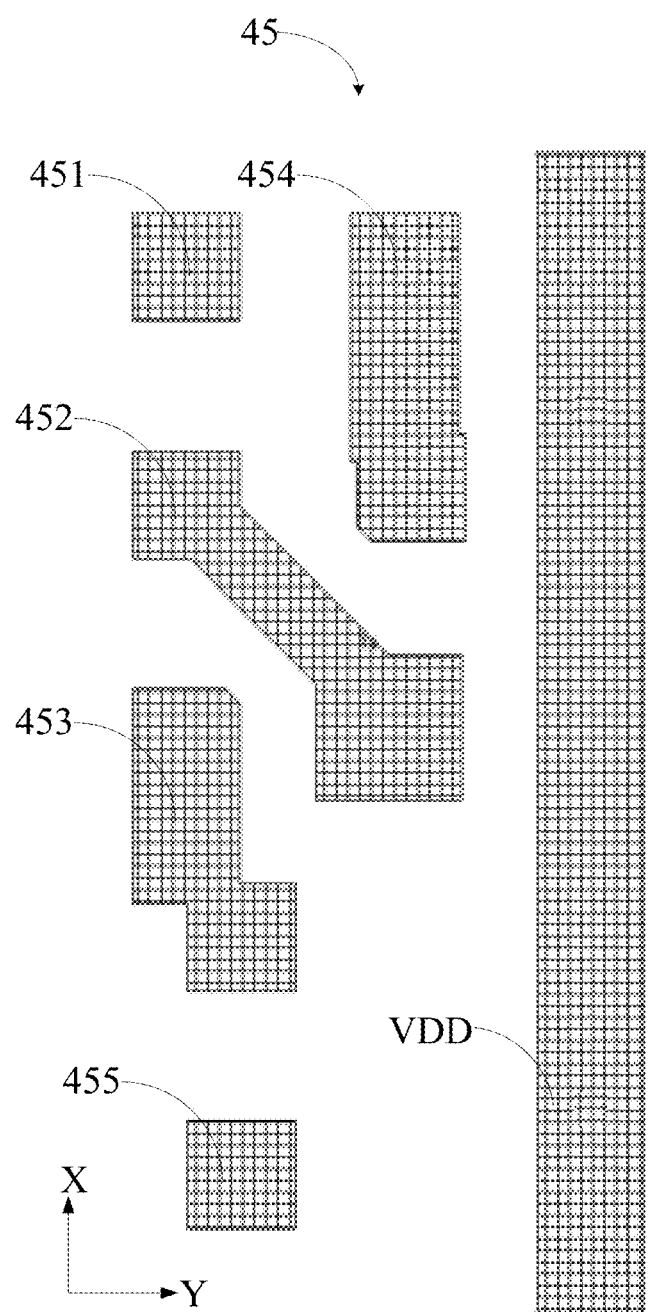

FIG. 13 illustrates the sixth conductive layer 45 of the oxide thin film transistor structure layer 40, where the sixth conductive layer 45 includes a power signal line VDD and a plurality of connection structures. The plurality of connection structures include a first connection structure 451, a second connection structure 452, a third connection structure 453, a fourth connection structure 454 and a fifth connection structure 455. The power signal line VDD extends along a second direction X.

In an embodiment, the sixth conductive layer 45 has a thickness of 200 nm to 800 nm. In some embodiments, the sixth conductive layer 45 has a thickness of, for example, 200 nm, 300 nm, 400 nm, 500 nm, 600 nm, 700 nm or 800 nm or the like.

In an embodiment, a material of the sixth conductive layer 45 includes at least one of metal molybdenum, metal aluminum, metal titanium or metal copper.

In an embodiment, the sixth conductive layer 45 may be formed by using magnetron sputter process, evaporation process or electroplating process.

Figure 14:
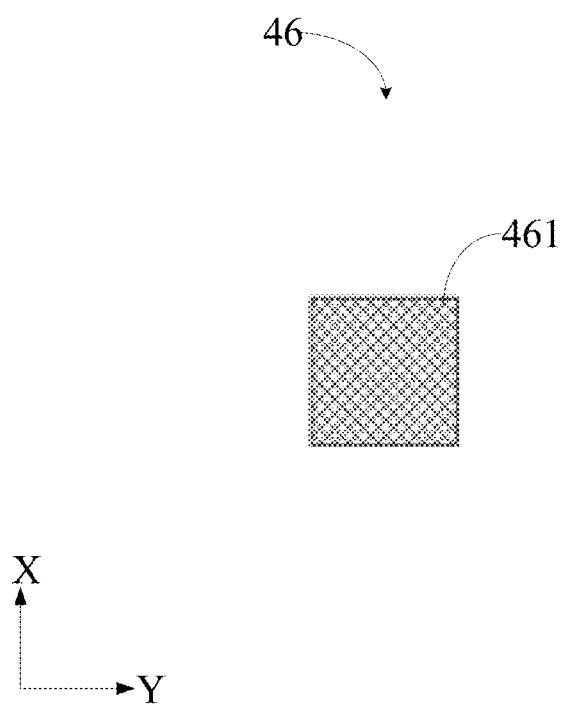

In an embodiment, the oxide thin film transistor structure layer 40 includes a planarization layer 46 at a side of the sixth conductive layer 45 away from the substrate (as shown in FIGS. 16 to 18), and the planarization layer 46 is for protecting the above sixth conductive layer 45. FIG. 14 is a schematic diagram illustrating a via hole of the planarization layer 46. As shown in FIG. 14, a via hole 461 is disposed on the planarization layer 46 to electrically connect a first electrode of a sub-pixel with a pixel circuit.

In an embodiment, the planarization layer 46 has a thickness of 1 μm to 2 μm. In some embodiments, the planarization layer 46 has a thickness of, for example, 1 μm, 1.2 μm, 1.4 μm, 1.6 μm, 1.8 μm or 2 μm or the like.

In an embodiment, a material of the planarization layer 46 may be an organic material, for example, Polyimide (PI) or Polystyrene (PS) or the like.

In an embodiment, a terminal of the first light emission control transistor T3 is connected with the drive transistor T1 and the data writing transistor T4 respectively, and the other terminal of the first light emission control transistor T3 is connected with one pole plate of the capacitor C; a terminal of the second light emission control transistor T6 is connected with the light-emitting element and the second reset transistor T2 respectively; a terminal of the first reset transistor T7 is connected with the threshold compensation transistor T5.

In an embodiment, the oxide semiconductor active structure of the oxide thin film transistor includes a first doping region, a second doping region and an active region between the first doping region and the second doping region, where one of the first doping region and the second doping region is a source region and the other is a drain region.

In an embodiment, as shown in FIGS. 2 to 18, the first connection structure 451 passes through the via hole 441 and via holes penetrating through the fourth insulation layer 48 and the third insulation layer 47 to electrically connect with a first conductive structure 411, and the via holes penetrating through the fourth insulation layer 48 and the third insulation layer 47 expose a side part of a first doping region of the second light emission control transistor T6 and thus the first connection structure 451 is electrically connected with the first doping region of the second light emission control transistor T6. The first conductive structure 411 is connected with a first connection part 251 through a via hole 31, and the first connection part 251 is electrically connected with a second doping region of the drive transistor T1 through a via hole 241. In this way, the first doping region of the second light emission control transistor T6 is electrically connected with the second doping region of the drive transistor T1.

In an embodiment, as shown in FIGS. 2 to 18, a terminal of the second connection structure 452 is electrically connected with the first electrode through the via hole 461 of the planarization layer 46; the other terminal of the second connection structure 452 passes through one via hole 441 and the via holes penetrating through the fourth insulation layer 48 and the third insulation layer 47 to electrically connect with a second doping region of the second light emission control transistor T6. In this way, the first electrode is electrically connected with the second doping region of the second light emission control transistor T6.

In an embodiment, as shown in FIGS. 2 to 18, the third connection structure 453 is connected with a reset power signal line Vint through a via hole 4412, and the third connection structure 453 is electrically connected with a first doping region of the second reset transistor T2 through a via hole 4411 and connected with a first doping region of the first reset transistor T7 through a via hole 4413. Therefore, the first doping region of the first reset transistor T7 and the first doping region of the second reset transistor T2 are electrically connected with the reset power signal line Vint respectively.

In an embodiment, as shown in FIGS. 2 to 18, the fourth connection structure 454 passes through one via hole 441 and the via holes penetrating through the fourth insulation layer 48 and the third insulation layer 47 to electrically connect with a second conductive structure 412, and the via holes penetrating through the fourth insulation layer 48 and the third insulation layer 47 expose a side wall of a second doping region of the first light emission control transistor T3 and thus the fourth connection structure 454 is electrically connected with the second doping region of the first light emission control transistor T3. The second conductive structure 412 is connected with a second connection part 252 through a via hole 31 and the second connection part 252 is electrically connected with a first doping region of the drive transistor T1 through the via hole 241. In the above manner, the second doping region of the first light emission control transistor T3 is electrically connected with the first doping region of the drive transistor T1.

In an embodiment, as shown in FIGS. 2 to 18, the fifth connection structure 455 passes through the via hole 441 and the via holes penetrating through the fourth insulation layer 48 and the third insulation layer 47 to electrically connect with a third conductive structure 413, and the via holes penetrating through the fourth insulation layer 48 and the third insulation layer 47 expose a side part of a second doping region of the first reset transistor T7 and thus the fifth connection structure 455 is electrically connected with the second doping region of the first reset transistor T7 through the via holes penetrating through the fourth insulation layer 48 and the third insulation layer 47. The third conductive structure 413 is connected with a third connection part 253 through a via hole 31, and the third connection part 253 is connected with the second doping region of the threshold compensation transistor T5 and the second pole plate 231 of the capacitor C through the via hole 241. In the above manner, the second doping region of the threshold compensation transistor T5 and the second pole plate 231 of the capacitor C are electrically connected with the second doping region of the first reset transistor T7.

In an embodiment, the reset power signal line Vint and an auxiliary signal line 416 are connected in parallel, and the auxiliary signal line may be connected with a reset power signal. With this disposal, the auxiliary signal line can reduce a voltage drop of the reset power signal line Vint. The reset power signal line Vint and the auxiliary signal line 416 may be connected in parallel through a wire outside a display region.

It is noted that the source region and the drain region of the thin film transistor adopted in the embodiments of the present disclosure are structurally identical, therefore, the source region and the drain region of the thin film transistor may be structurally indistinguishable and may be interchangeable based on actual needs.

In a display baseplate provided by the embodiments of the present disclosure, as shown in FIGS. 15 to 18 an orthographic projection of the polycrystalline silicon active layer 21 on the substrate 10 is partially overlapped with an orthographic projection of the oxide semiconductor active layer 42 on the substrate 10.

During a preparation process of the polycrystalline silicon active layer 21 of a polycrystalline silicon thin film transistor, a large amount of hydrogen element is to be introduced to ensure characteristics of the polycrystalline silicon thin film transistor. Further, some preparation steps of the polycrystalline silicon thin film transistor have a high process temperature, and hydrogen element, oxygen element and other doping agents may be easily caused to diffuse toward an oxide semiconductor active layer of an oxide thin film transistor when subjected to the high temperature processes, thus leading to a lower reliability of a pixel circuit.

In a display baseplate provided by the embodiments of the present disclosure, an insulation layer 30 is disposed between a polycrystalline silicon thin film transistor structure layer 20 and an oxide thin film transistor structure layer 40, and the insulation layer 30 can block diffusion of hydrogen element, oxygen element and a doping agent generated by a polycrystalline silicon active layer 21 toward an oxide semiconductor active layer 42 so as to prevent their influence on characteristics of oxide semiconductor thin film transistors. Further, there is a time interval between a preparation process of the polycrystalline silicon thin film transistor structure layer 20 and a preparation process of the oxide thin film transistor structure layer 40, which helps to prevent the influence of hydrogen element, oxygen element and the doping agent generated by the polycrystalline silicon thin film transistor structure layer 20 on the oxide semiconductor active layer 42. Therefore, an orthographic projection of the polycrystalline silicon active layer 21 on the substrate 10 may be partially overlapped with an orthographic projection of the oxide semiconductor active layer 42 on the substrate 10 such that a pixel circuit occupies a smaller space, helping to increase PPI of the display baseplate; furthermore, the insulation layer 30 also helps to avoid generating a parasitic capacitor between a conductive film layer of the polycrystalline silicon thin film transistor structure layer 20 and a conductive film layer of the oxide thin film transistor structure layer 40. Because the polycrystalline silicon thin film transistor structure layer 20 is prepared prior to the insulation layer 30, the processing temperature of the polycrystalline silicon thin film transistor structure layer 20 will not affect the insulation layer 30. The oxide thin film transistor structure layer 40 is prepared after the insulation layer 30, but the oxide thin film transistor structure layer 40 will not affect the insulation layer 30 due to a lower processing temperature of the oxide thin film transistor structure layer 40.

In an embodiment, in at least one pixel circuit, the orthographic projection of the polycrystalline silicon active layer 21 on the substrate 10 is partially overlapped with the orthographic projection of the oxide semiconductor active layer 42 on the substrate 10, that is, in a same pixel circuit, the orthographic projection of the polycrystalline silicon active layer 21 on the substrate is partially overlapped with the orthographic projection of the oxide semiconductor active layer 42 on the substrate 10.

Furthermore, in a pixel circuit of each of sub-pixels of the display baseplate, the orthographic projection of the polycrystalline silicon active layer 21 on the substrate 10 is partially overlapped with the orthographic projection of the oxide semiconductor active layer 42 on the substrate 10. With this disposal, the PPI of the display baseplate may be maximized.

In an embodiment, the insulation layer 30 has a thickness of 10 μm to 100 μm. With this disposal, the insulation layer 30 cannot effectively block the hydrogen element, the oxygen element and the doping agents generated by the polycrystalline silicon thin film transistor structure layer 20 due to an excessively small thickness of the insulation layer 30 may be avoided, and the display baseplate has a larger thickness due to an excessively large thickness of the insulation layer 30, which is unfavorable for making the display baseplate lighter and thinner may be avoided as well. In some embodiments, the insulation layer 30 has a thickness of, for example, 10 μm, 20 μm, 30 μm, 40 μm, 50 μm, 60 μm, 70 μm, 80 μm, 90 μm or 100 μm or the like.

In an embodiment, the insulation layer 30 includes an organic film layer and an inorganic film layer stacked alternately. With this disposal, the effect that the insulation layer 30 blocks hydrogen element, oxygen element and doping agents may be increased. In some embodiments, a material of the organic film layer may be, for example, PI, Polydimethylsiloxane (PDMS), polymethyl methacrylate (PMMA), and Cyclo Olefin Polymer (COP) and the like; a material of the inorganic film layer may be, for example, silicon oxide, silicon nitride or silicon oxynitride or the like.

In an embodiment, in at least one pixel circuit, an orthographic projection of a polycrystalline silicon active structure of the threshold compensation transistor T5 on the substrate 10 is overlapped with an orthographic projection of an oxide semiconductor active structure of the first reset transistor T7 on the substrate 10.

Furthermore, an orthographic projection of a channel of the threshold compensation transistor T5 on the substrate is overlapped with an orthographic projection of a channel of the first reset transistor T7 on the substrate. With this disposal, the polycrystalline silicon active structure of the threshold compensation transistor T5 is overlapped in larger area with the oxide semiconductor active structure of the first reset transistor T7, which helps to reduce space occupied by the pixel circuit, further increasing the PPI of the display baseplate.

In an embodiment, in at least one pixel circuit, at least one polycrystalline silicon thin film transistor includes the drive transistor T1, the data writing transistor T4 and the threshold compensation transistor T5; at least one oxide semiconductor transistor includes the first light emission control transistor T3, the second light emission control transistor T6, the first reset transistor T7 and the second reset transistor T2. A terminal of the first light emission control transistor T3 is connected with the drive transistor T1 and the data writing transistor T4 respectively, and a terminal of the second light emission control transistor T6 is connected with the light-emitting element and the second reset transistor T2; a terminal of the first reset transistor T7 is connected with the threshold compensation transistor T5. With this disposal, the polycrystalline silicon thin film transistors and the oxide semiconductor thin film transistors are functioned as functional transistors in the pixel circuit at a same time. Due to high mobility of the low temperature polycrystalline silicon thin film transistor, a capacitor can be charged faster and the oxide semiconductor thin film transistor may have a lower leakage current. In this way, advantages of the two kind of transistors can be combined to prepare a display baseplate with high resolution, low power consumption and high picture quality.

In an embodiment, in at least one pixel circuit, a first region 401, a second region 402 and a third region 403 of the oxide semiconductor active layer 42 are arranged in a spacing. The first region 401 includes an oxide semiconductor active structure of the second light emission control transistor T6 and an oxide semiconductor active structure of the second reset transistor T2, the second region 402 includes an oxide semiconductor active structure of the first light emission control transistor T3, and the third region 403 includes an oxide semiconductor active structure of the first reset transistor T7. The polycrystalline silicon active layer 21 includes a fourth region 201 of each pixel circuits. The fourth region 201 includes a polycrystalline silicon active structure of the drive transistor T1, a polycrystalline silicon active structure of the data writing transistor T4 and a polycrystalline silicon active structure of the threshold compensation transistor T5. That is, the oxide semiconductor active structure of the second light emission control transistor T6 and the oxide semiconductor active structure of the second reset transistor T2 are one integral pattern, the oxide semiconductor active structure of the first light emission control transistor T3 is one integral pattern, and the oxide semiconductor active structure of the first reset transistor T7 is one integral pattern; and the polycrystalline silicon active structure of the drive transistor T1, the polycrystalline silicon active structure of the data writing transistor T4 and the polycrystalline silicon active structure of the threshold compensation transistor T5 are one integral pattern. This disposal facilitates connections among thin film transistors in the pixel circuit.

In at least one pixel circuit, an orthographic projection of at least one of the first region 401, the second region 402 or the third region 403 on the substrate 10 is overlapped with an orthographic projection of the fourth region 201 on the substrate 10.

Furthermore, in at least one pixel circuit, the orthographic projection of the first region 401 on the substrate 10, the orthographic projection of the second region 402 on the substrate 10 and the orthographic projection of the third region 403 on the substrate 10 are all overlapped with the orthographic projection of the fourth region 201 on the substrate 10. In this way, the space occupied by the pixel circuit can be reduced further, thus further improving the PPI of the display baseplate.

In an embodiment, the polycrystalline silicon thin film transistor structure layer 20 includes a first signal line, and the oxide thin film transistor structure layer 40 includes a second signal line. An orthographic projection of the first signal line on the substrate 10 is overlapped with an orthographic projection of the second signal line on the substrate 10. The insulation layer 30 is disposed between the polycrystalline silicon thin film transistor structure layer 20 and the oxide thin film transistor structure layer 40 to help avoid signal interference between the first signal line and the second signal line, thus avoiding generating a parasitic capacitor between the first signal line and the second signal line. Compared with related solutions in which a large spacing is disposed between the first signal line and the second signal line to avoid generating a parasitic capacitor, the space for disposing the first signal line and the second signal line can be reduced such that more pixel circuits can be disposed on the display baseplate, further increasing the PPI of the display baseplate.

Figure 15:
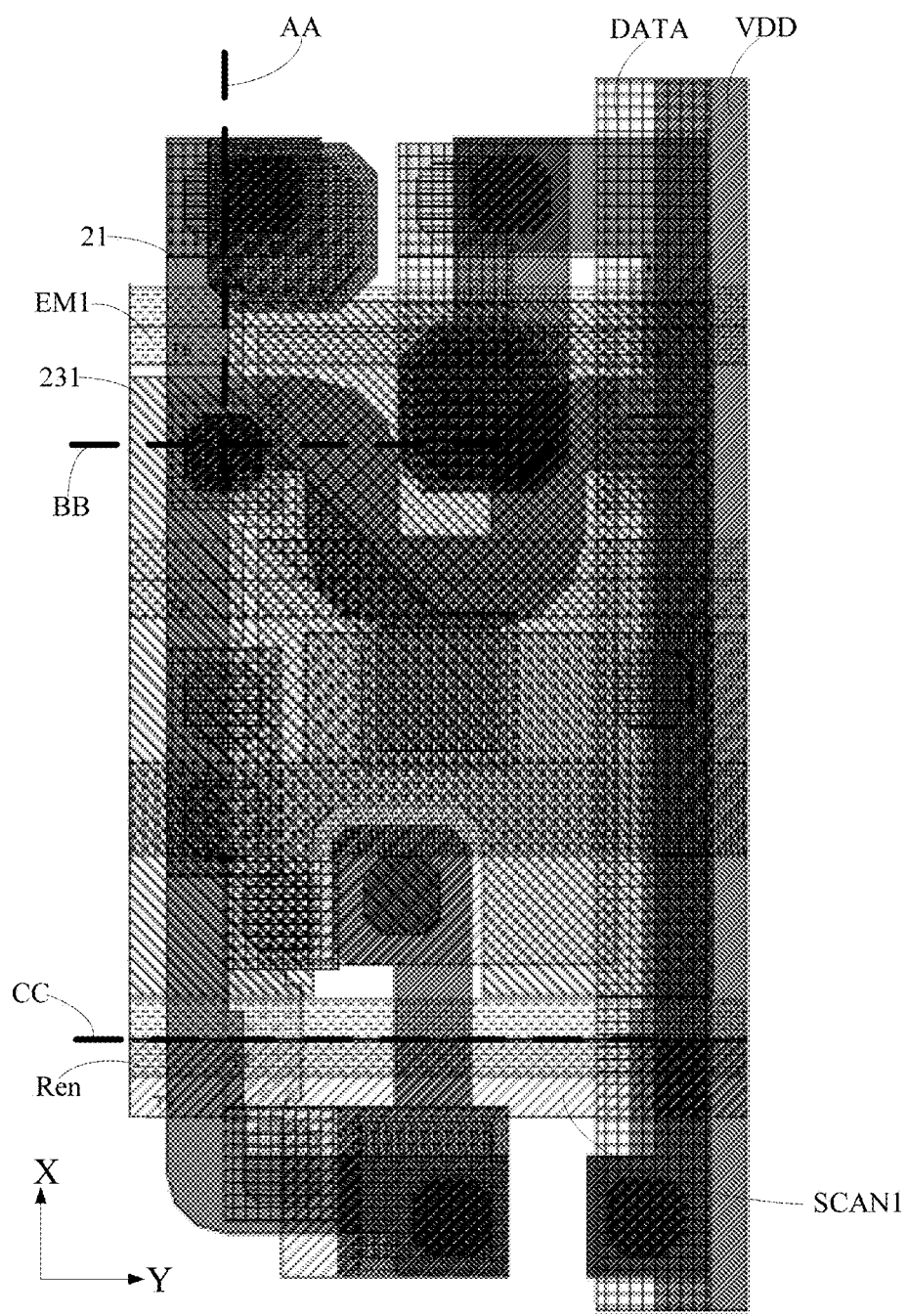

In an embodiment, as shown in FIG. 15, the first signal line includes a scan signal line SCAN1 connected with a gate of the threshold compensation transistor T5; the second signal line includes a first reset control signal line Ren connected with a gate of the first reset transistor T7. An orthographic projection of the scan signal line SCAN1 on the substrate 10 is overlapped with an orthographic projection of the first reset control signal line Ren on the substrate 10. Furthermore, an orthographic projection of a body part SCAN11 of the scan signal line SCAN1 on the substrate 10 is overlapped with the orthographic projection of the first reset control signal line Ren on the substrate 10.

In an embodiment, as shown in FIG. 15, the first signal line includes a data signal line DATA; the second signal line includes a power signal line VDD. The data signal line DATA and the power signal line VDD extend in a same direction. An orthographic projection of the data signal line DATA on the substrate 10 is overlapped with an orthographic projection of the power signal line VDD on the substrate 10. Further, the orthographic projection of the data signal line DATA on the substrate 10 is partially overlapped with the orthographic projection of the power signal line VDD on the substrate 10.

In an embodiment, when the display baseplate is prepared, the substrate 10 is formed on a carrier plate where a laser de-bonding layer (DBL) is disposed between the carrier plate and the substrate 10. The disposal of the laser de-bonding layer helps to separate the substrate of the display baseplate from the carrier plate after completion of the preparation of the display baseplate. The carrier plate may be a glass carrier plate.

In some embodiments, a material of the laser de-bonding layer may be an inorganic material or organic material. When the material of the laser de-bonding layer is an organic material, the material of the laser de-bonding layer may be PI. In some embodiments, the laser de-bonding layer may be prepared using screen printing method.

In an embodiment, the laser de-bonding layer has a thickness of 80 nm to 200 nm. In some embodiments, the laser de-bonding layer has a thickness of, for example, 80 nm, 100 nm, 120 nm, 140 nm, 160 nm, 180 nm or 200 nm or the like.

In an embodiment, as shown in FIGS. 16 to 18, the display baseplate further includes a pixel defining layer 52. The pixel defining layer 52 is provided with a plurality of pixel openings in one-to-one correspondence with the sub-pixels. Each of the pixel openings exposes a first electrode 51 of a corresponding sub-pixel.

In an embodiment, a material of the pixel defining layer 52 is an organic material, for example, PI, PS or the like. The pixel defining layer 52 has a thickness of 1 μm to 2 μm. In some embodiments, the pixel defining layer 52 has a thickness of, for example, 1 μm, 1.2 μm, 1.4 μm, 1.6 μm, 1.8 μm or 2 μm or the like.

In an embodiment, the first electrode includes two indium tin oxide film layers and a silver film layer disposed between the two indium tin oxide film layers. The indium tin oxide film layer has a thickness of, for example, 8 nm and the silver film layer has a thickness of, for example, 10 nm.

Embodiments of the present disclosure further provide a display panel, including a display baseplate according to any one of the above embodiments.

In an embodiment, the display panel further includes a packaging layer located at a side of the display baseplate away from the substrate. The packaging layer may be, for example, a thin film packaging layer.

Embodiment of the present disclosure further provide a display apparatus including a display panel according to any one of the above embodiments.

In an embodiment, the display apparatus further includes a driver and a power circuit, where the driver provides a drive signal for driving a light-emitting structure to emit light and the power circuit is for providing power to the display panel.

In an embodiment, the display apparatus further includes a housing in which the display panel is disposed.

The display apparatus provided by the embodiments of the present disclosure may be, for example, a mobile phone, a tablet computer, a TV, a laptop computer, a vehicle-mounted device or any other device having display function.

It is noted that in the drawings of the embodiments of the present disclosure, FIG. 15 only illustrates a part of film layers in structures shown in FIGS. 16 to 18.

It should be noted that in the accompanying drawings, for illustration clarity, sizes of some layers or regions may be exaggerated. Furthermore, it may be understood that when an element or layer is referred to as being "on" another element or layer, such element or layer may be directly on the another element or layer or there is an intermediate layer therebetween. Further, it is understood that when an element or layer is referred to as being "under" another element or layer, such element or layer may be directly under the another element or layer, or one or more intermediate elements or layers are present therebetween. In addition, it may also be understood that when a layer or element is referred to as being between two layers or elements, such layer or element may be a sole layer between the two layers or elements, or one or more intermediate layers or elements are present. Like reference signs throughout the descriptions indicate like elements.

Other implementations of the present disclosure will be apparent to those skilled in the art from consideration of the specification and practice of the present disclosure herein. The present disclosure is intended to cover any variations, uses, modification or adaptations of the present disclosure that follow the general principles thereof and include common knowledge or conventional technical means in the related art that are not disclosed in the present disclosure. The specification and examples are considered as exemplary only, with a true scope and spirit of the present disclosure being indicated by the following claims.

It is to be understood that the present disclosure is not limited to the precise structure described above and shown in the accompanying drawings, and that various modifications and changes may be made without departing from the scope thereof. The scope of the present disclosure is limited only by the appended claims.

The invention claimed is:

1. A display baseplate, comprising: a substrate; a polycrystalline silicon thin film transistor structure layer located on the substrate; an insulation layer located at a side of the polycrystalline silicon thin film transistor structure layer away from the substrate; and an oxide thin film transistor structure layer located at a side of the insulation layer away from the substrate,
wherein: the display baseplate comprises a plurality of sub-pixels located on the substrate, and at least one of the sub-pixels comprises a light-emitting element and a pixel circuit for driving the light-emitting element;
the pixel circuit comprises a polycrystalline silicon active layer located in the polycrystalline silicon thin film transistor structure layer and an oxide semiconductor active layer located in the oxide thin film transistor structure layer;
an orthographic projection of the polycrystalline silicon active layer on the substrate is at least partially overlapped with an orthographic projection of the oxide semiconductor active layer on the substrate; and
wherein: the polycrystalline silicon thin film transistor structure layer further comprises:
a first conductive layer located at a side of the polycrystalline silicon active layer away from the substrate;
a second conductive layer located at a side of the first conductive layer away from the substrate;
a third conductive layer located at a side of the second conductive layer away from the substrate; and
the polycrystalline silicon thin film transistor structure layer comprises a capacitor;
the first conductive layer comprises a first pole plate of the capacitor and a scan signal line configured to provide a scan signal to the pixel circuit;
the second conductive layer comprises a second pole plate of the capacitor; and
the third conductive layer comprises a data signal line configured to provide a data signal to the pixel circuit.

2. The display baseplate of claim 1, wherein the insulation layer has a thickness of 10 μm to 100 μm.

3. The display baseplate of claim 1, wherein the insulation layer comprises one or more organic film layers and one or more inorganic film layers which are stacked alternately.

4. The display baseplate of claim 1, wherein:
the pixel circuit comprises one or more polycrystalline silicon thin film transistors located in the polycrystalline silicon thin film transistor structure layer and one or more oxide semiconductor transistors located in the oxide thin film transistor structure layer;
the polycrystalline silicon active layer comprises a polycrystalline silicon active structure of each of the polycrystalline silicon thin film transistors, and the oxide semiconductor active layer comprises an oxide semiconductor active structure of each of the oxide semiconductor transistors;
the one or more polycrystalline silicon thin film transistors comprise a threshold compensation transistor, the one or more oxide semiconductor transistors comprise a first reset transistor, and the first reset transistor is connected with the threshold compensation transistor; and
in at least one of the pixel circuits, an orthographic projection of the polycrystalline silicon active structure of the threshold compensation transistor on the substrate is at least partially overlapped with an orthographic projection of the oxide semiconductor active structure of the first reset transistor on the substrate.

5. The display baseplate of claim 1, wherein:
the pixel circuit comprises one or more polycrystalline silicon thin film transistors located in the polycrystalline silicon thin film transistor structure layer and one or more oxide semiconductor transistors located in the oxide thin film transistor structure layer;
the one or more polycrystalline silicon thin film transistors comprise a drive transistor, a data writing transistor and a threshold compensation transistor;
the one or more oxide semiconductor transistors comprise a first light emission control transistor, a second light emission control transistor, a first reset transistor and a second reset transistor;
a terminal of the first light emission control transistor is connected with the drive transistor and the data writing transistor respectively;
a terminal of the second light emission control transistor is connected with the light-emitting element and the second reset transistor respectively; and
a terminal of the first reset transistor is connected with the threshold compensation transistor.

6. The display baseplate of claim 5, wherein:
the polycrystalline silicon active layer comprises a polycrystalline silicon active structure of each of the polycrystalline silicon thin film transistors, and the oxide semiconductor active layer comprises an oxide semiconductor active structure of each of the oxide semiconductor transistors;
the oxide semiconductor active layer comprises a first region, a second region and a third region of each of the pixel circuits, and the first region, the second region and the third region are disposed in a spacing;
the first region comprises an oxide semiconductor active structure of the second light emission control transistor and an oxide semiconductor active structure of the second reset transistor;
the second region comprises an oxide semiconductor active structure of the first light emission control transistor;
the third region comprises an oxide semiconductor active structure of the first reset transistor;
the polycrystalline silicon active layer comprises a fourth region of each of the pixel circuits, the fourth region comprises a polycrystalline silicon active structure of the drive transistor, a polycrystalline silicon active structure of the data writing transistor and a polycrystalline silicon active structure of the threshold compensation transistor; and
in at least one of the pixel circuits, an orthographic projection of at least one of the first region, the second region or the third region on the substrate is at least partially overlapped with an orthographic projection of the fourth region on the substrate.

7. The display baseplate of claim 6, wherein in at least one of the pixel circuits, the orthographic projection of the first region on the substrate, the orthographic projection of the second region on the substrate and the orthographic projection of the third region on the substrate are all at least partially overlapped with the orthographic projection of the fourth region on the substrate.

8. The display baseplate of claim 1, wherein:
the polycrystalline silicon thin film transistor structure layer comprises a first signal line;
the oxide thin film transistor structure layer comprises a second signal line; and an orthographic projection of the first signal line on the substrate is at least partially overlapped with an orthographic projection of the second signal line on the substrate.

9. The display baseplate of claim 8, wherein:
the pixel circuit comprises one or more polycrystalline silicon thin film transistors located in the polycrystalline silicon thin film transistor structure layer and one or more oxide semiconductor transistors located in the oxide thin film transistor structure layer;
the polycrystalline silicon active layer comprises a polycrystalline silicon active structure of each of the polycrystalline silicon thin film transistors, and the oxide semiconductor active layer comprises an oxide semiconductor active structure of each of the oxide semiconductor transistors;
the one or more polycrystalline silicon thin film transistors comprise a threshold compensation transistor, the one or more oxide semiconductor transistors comprise a first reset transistor, and the first reset transistor is connected with the threshold compensation transistor;
the first signal line comprises a scan signal line connected with a gate of the threshold compensation transistor, and the scan signal line is configured to provide a scan signal to the threshold compensation transistor;
the second signal line comprises a first reset control signal line connected with a gate of the first reset transistor, and the first reset control signal line is configured to provide a reset signal to the first reset transistor; and
an orthographic projection of the scan signal line on the substrate is at least partially overlapped with an orthographic projection of the first reset control signal line on the substrate.

10. The display baseplate of claim 8, wherein:
the first signal line comprises a data signal line configured to provide a data signal to the pixel circuit;
the second signal line comprises a power signal line configured to provide a power signal to the pixel circuit;
the data signal line and the power signal line extend in a same direction; and
an orthographic projection of the data signal line on the substrate is at least partially overlapped with an orthographic projection of the power signal line on the substrate.

11. The display baseplate of claim 1, wherein the pixel circuit comprises a capacitor, and the capacitor is located in the polycrystalline silicon thin film transistor structure layer.

12. The display baseplate of claim 11, wherein:
the capacitor comprises a first pole plate and a second pole plate located at a side of the first pole plate away from the substrate;
the polycrystalline silicon thin film transistor structure layer comprises a scan signal line and a data signal line;
the scan signal line is configured to provide a scan signal to the pixel circuit, and the data signal line is configured to provide a data signal to the pixel circuit; and
the first pole plate and the scan signal line are disposed in a same layer, and the second pole plate is located between the first pole plate and the data signal line.

13. The display baseplate of claim 1, wherein:
the pixel circuit comprises one or more polycrystalline silicon thin film transistors located in the polycrystalline silicon thin film transistor structure layer and one or more oxide semiconductor transistors located in the oxide thin film transistor structure layer; and
the third conductive layer further comprises a connection portion configured to electrically connect the one or more polycrystalline silicon thin film transistors with the one or more oxide semiconductor transistors.

14. The display baseplate of claim 1, wherein:
the oxide thin film transistor structure layer further comprises:
a fourth conductive layer located at a side of the oxide semiconductor active layer close to the substrate;
a fifth conductive layer located at a side of the oxide semiconductor active layer away from the substrate; and
a sixth conductive layer located at a side of the fifth conductive layer away from the substrate;
wherein the fourth conductive layer comprises an auxiliary signal line;
the fifth conductive layer comprises a light emission control signal line, a first reset control signal line, a reset power signal line and a second reset control signal line;
the light emission control signal line is configured to provide a light emission control signal to the pixel circuit;
the first reset control signal line and the second reset control signal line are configured to provide one or more reset control signals to the pixel circuit;
the reset power signal line is configured to provide a reset power signal to the pixel circuit;
the auxiliary signal line is connected with the reset power signal line in parallel; and
the sixth conductive layer comprises a power signal line configured to provide a power signal to the pixel circuit.

15. The display baseplate of claim 14, wherein:
the pixel circuit comprises one or more polycrystalline silicon thin film transistors located in the polycrystalline silicon thin film transistor structure layer and one or more oxide semiconductor transistors located in the oxide thin film transistor structure layer;
the fourth conductive layer further comprises a conductive structure;
the sixth conductive layer further comprises a connection structure; and
the conductive structure and the connection structure are configured to electrically connect the one or more polycrystalline silicon thin film transistors with the one or more oxide semiconductor transistors.

16. A display panel, comprising the display baseplate according to claim 1.

17. A display apparatus, comprising the display panel according to claim 16.

18. The display panel of claim 16, wherein the insulation layer has a thickness of 10 μm to 100 μm.

19. The display panel of claim 16, wherein the insulation layer comprises one or more organic film layers and one or more inorganic film layers which are stacked alternately.

* * * * *